(12) United States Patent  
Yamazaki

(10) Patent No.: US 9,831,351 B2  
(45) Date of Patent: *Nov. 28, 2017

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/040,092

(22) Filed: Feb. 10, 2016

(65) Prior Publication Data

US 2016/0155854 A1 Jun. 2, 2016

Related U.S. Application Data

(63) Continuation of application No. 14/028,776, filed on Sep. 17, 2013, now Pat. No. 9,269,821.

(30) Foreign Application Priority Data

Sep. 24, 2012 (JP) ................. 2012-210230

(51) Int. Cl.  
*H01L 29/10* (2006.01)  
*H01L 21/332* (2006.01)  
*H01L 29/786* (2006.01)

(52) U.S. Cl.  
CPC ...... *H01L 29/7869* (2013.01); *H01L 29/1054* (2013.01); *H01L 29/78696* (2013.01)

(58) Field of Classification Search  
USPC .......... 257/20, 194, 135–136, 213–413, 900, 257/902–903  
See application file for complete search history.

(56) References Cited

U.S. PATENT DOCUMENTS 5,488,030 A 1/1996 Tanaka et al.  
5,528,032 A 6/1996 Uchiyama  
(Continued)

FOREIGN PATENT DOCUMENTS

CN 101487961 A 7/2009  
CN 101506986 A 8/2009  
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Julio J Maldonado  
*Assistant Examiner* — Moin Rahman  
(74) *Attorney, Agent, or Firm* — Fish & Richardson P.C.

(57) ABSTRACT

A transistor including an oxide semiconductor layer can have stable electrical characteristics. In addition, a highly reliable semiconductor device including the transistor is provided. A semiconductor device includes a multi-layer film including an oxide layer and an oxide semiconductor layer, a gate insulating film in contact with the multi-layer film, and a gate electrode overlapping with the multi-layer film with the gate insulating film provided therebetween. In the semiconductor device, the oxide semiconductor layer contains indium, the oxide semiconductor layer is in contact with the oxide layer, and the oxide layer contains indium and has a larger energy gap than the oxide semiconductor layer.

9 Claims, 27 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,178,884 B2 | 5/2012 | Ha et al. |
| 8,188,480 B2 | 5/2012 | Itai |
| 8,193,535 B2 | 6/2012 | Ha et al. |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,319,905 B2 | 11/2012 | Yoon et al. |
| 8,415,198 B2 | 4/2013 | Itagaki et al. |
| 8,476,719 B2 | 7/2013 | Endo et al. |
| 8,502,221 B2 | 8/2013 | Yamazaki |
| 8,525,304 B2 | 9/2013 | Endo et al. |
| 8,541,258 B2 | 9/2013 | Kim et al. |
| 8,692,252 B2 | 4/2014 | Takata et al. |
| 8,728,862 B2 | 5/2014 | Ha et al. |
| 8,952,381 B2 | 2/2015 | Yamazaki |
| 8,987,731 B2 | 3/2015 | Yamazaki |
| 9,029,852 B2 | 5/2015 | Honda et al. |
| 9,035,313 B2 | 5/2015 | Jeong et al. |
| 9,076,874 B2 | 7/2015 | Yamazaki et al. |
| 9,269,821 B2 * | 2/2016 | Yamazaki ......... H01L 29/78696 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0180045 A1 | 7/2009 | Yoon et al. |
| 2009/0206332 A1 | 8/2009 | Son et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0321732 A1 | 12/2009 | Kim et al. |
| 2010/0038641 A1 | 2/2010 | Imai |
| 2010/0065844 A1 * | 3/2010 | Tokunaga ......... H01L 29/78606 257/43 |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0320458 A1 | 12/2010 | Umeda et al. |
| 2010/0320459 A1 | 12/2010 | Umeda et al. |
| 2011/0127523 A1 | 6/2011 | Yamazaki |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0204355 A1 | 8/2011 | Suzuki et al. |
| 2011/0215328 A1 | 9/2011 | Morosawa et al. |
| 2011/0240990 A1 | 10/2011 | Yamazaki |
| 2011/0284846 A1 | 11/2011 | Endo et al. |
| 2011/0309411 A1 | 12/2011 | Takemura |
| 2012/0032730 A1 | 2/2012 | Koyama |
| 2012/0085974 A1 | 4/2012 | Kizaki |
| 2012/0119205 A1 | 5/2012 | Taniguchi et al. |
| 2012/0161133 A1 | 6/2012 | Yamazaki |
| 2012/0187395 A1 | 7/2012 | Koezuka |
| 2012/0305913 A1 | 12/2012 | Yamazaki et al. |
| 2012/0319183 A1 | 12/2012 | Yamazaki et al. |
| 2013/0200365 A1 | 8/2013 | Yamazaki |
| 2013/0240879 A1 | 9/2013 | Kim et al. |
| 2013/0320334 A1 | 12/2013 | Yamazaki et al. |
| 2013/0334533 A1 | 12/2013 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |

(56) References Cited

U.S. PATENT DOCUMENTS

| | | |
|---|---|---|
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0091301 A1 | 4/2014 | Yamazaki |

FOREIGN PATENT DOCUMENTS

| | | |
|---|---|---|
| CN | 101621076 A | 1/2010 |
| CN | 102403361 A | 4/2012 |
| CN | 102834922 A | 12/2012 |
| CN | 102934232 A | 2/2013 |
| EP | 1737044 A | 12/2006 |
| EP | 2141744 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-150158 A | 6/2007 |
| JP | 2009-170905 A | 7/2009 |
| JP | 2009-231613 A | 10/2009 |
| JP | 2010-016347 A | 1/2010 |
| JP | 2010-016348 A | 1/2010 |
| JP | 2010-021520 A | 1/2010 |
| JP | 4415062 | 2/2010 |
| JP | 2010-067954 A | 3/2010 |
| JP | 2010-073881 A | 4/2010 |
| JP | 2010-177431 A | 8/2010 |
| JP | 4571221 | 10/2010 |
| JP | 2011-049448 A | 3/2011 |
| JP | 2011-124360 A | 6/2011 |
| JP | 2011-228695 A | 11/2011 |
| JP | 2011-243745 A | 12/2011 |
| JP | 2012-023352 A | 2/2012 |
| JP | 2012-059860 A | 3/2012 |
| JP | 2012-119672 A | 6/2012 |
| JP | 2012-151462 A | 8/2012 |
| JP | 2012-160679 A | 8/2012 |
| JP | 2012-164978 A | 8/2012 |
| KR | 2009-0078568 A | 7/2009 |
| KR | 2010-0002503 A | 1/2010 |
| KR | 2012-0026005 A | 3/2012 |
| KR | 2012-0084678 A | 7/2012 |
| KR | 2013-0032304 A | 4/2013 |
| KR | 2013-0051468 A | 5/2013 |
| KR | 2013-0054458 A | 5/2013 |
| TW | 200947086 | 11/2009 |
| TW | 201214705 | 4/2012 |
| TW | 201222823 | 6/2012 |
| WO | WO-2004/114391 | 12/2004 |
| WO | WO-2008/023553 | 2/2008 |
| WO | WO-2008/133345 | 11/2008 |
| WO | WO-2011/122364 | 10/2011 |
| WO | WO-2011/158888 | 12/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGAO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Kimizuka.N et al., "Syntheses and Single-Crystal Data of Homologous Compounds, In2O3(ZnO)m (m=3, 4, and 5), InGAO3(ZnO)3, and Ga2O3(ZnO)m (m=7, 8, 9, and 16) in the InGa2O3—Zn2O4—ZnO System", Journal of Solid State Chemistry, Apr. 1, 1995, vol. 116, No. 1, pp. 170-178.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2013/075396) dated Oct. 29, 2013.

Written Opinion (Application No. PCT/JP2013/075396) dated Oct. 29, 2013.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201380049515.4) dated Jan. 4, 2017.

Chinese Office Action (Application No. 201380049515.4) dated Sep. 13, 2017.

\* cited by examiner

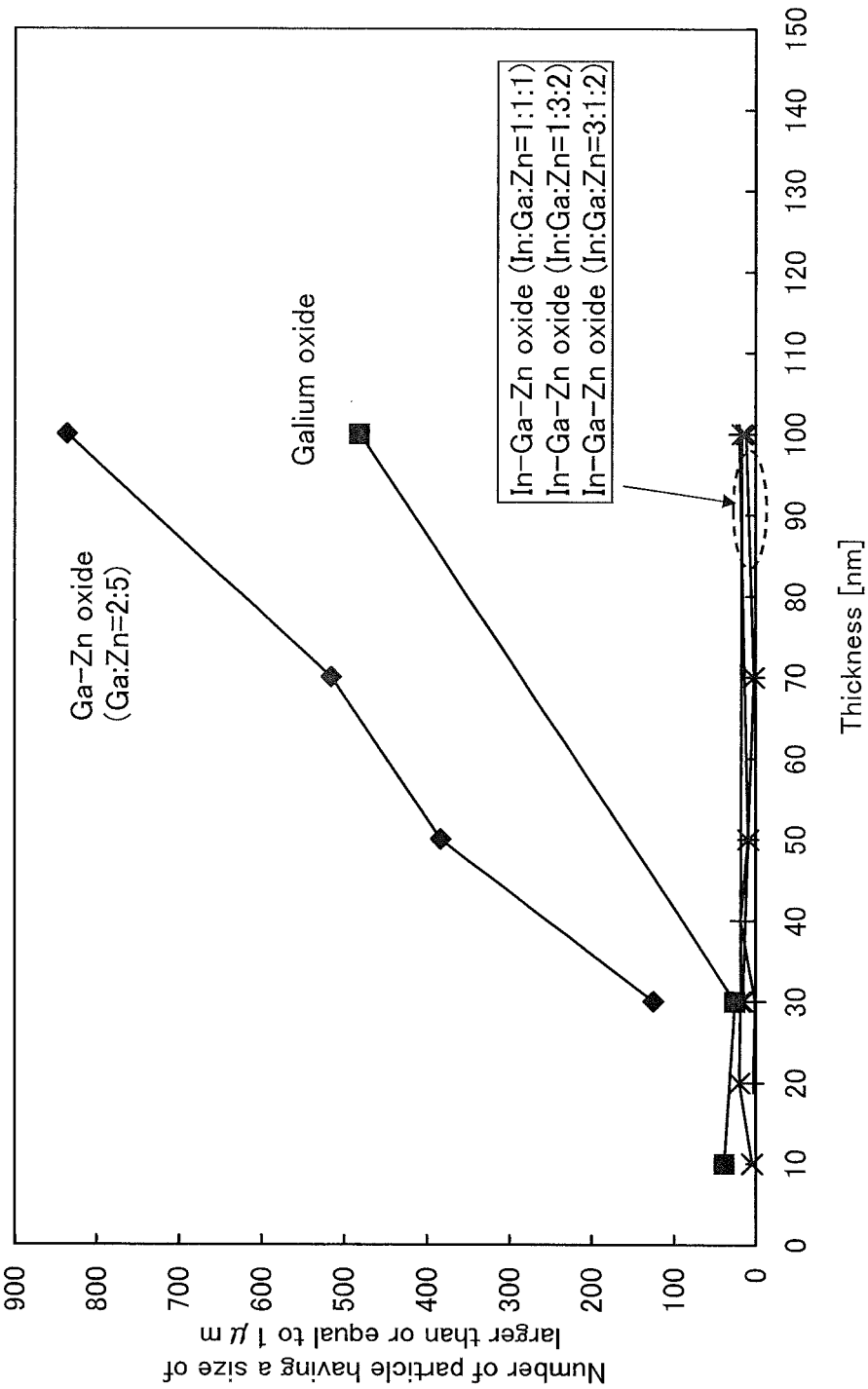

SEMICONDUCTOR DEVICE

CROSS-REFERENCE TO RELATED APPLICATIONS

This application is a continuation of U.S. application Ser. No. 14/028,776, filed Sep. 17, 2013, now allowed, which claims the benefit of a foreign priority application filed in Japan as Serial No. 2012-210230 on Sep. 24, 2012, both of which are incorporated by reference.

TECHNICAL FIELD

The present invention relates to a semiconductor device and a fabrication method of the semiconductor device.

Note that in this specification, a semiconductor device refers to any device that can function by utilizing semiconductor characteristics, and an electro-optical device, a semiconductor circuit, an electronic device, and the like are all semiconductor devices.

BACKGROUND ART

A technique by which a transistor is formed using a semiconductor layer formed over a substrate having an insulating surface has been attracting attention. The transistor is applied to a wide range of semiconductor devices such as an integrated circuit and a display device. A silicon film is widely known as a semiconductor layer applicable to the transistor.

Whether an amorphous silicon film or a polycrystalline silicon film is used as a semiconductor layer of a transistor depends on the purpose. For example, for a transistor in a large-sized display device, an amorphous silicon film is preferably used because a technique for forming a film on a large-sized substrate has been established. On the other hand, for a transistor included in a high-performance display device where driver circuits are formed over the same substrate, a polycrystalline silicon film which can form a transistor having a high field-effect mobility is preferably used. As a method for forming a polycrystalline silicon film, high-temperature heat treatment or a laser process which is performed on an amorphous silicon film has been known.

Further, in recent years, an oxide semiconductor layer has been attracting attention. For example, a transistor including an oxide semiconductor layer which contains indium, gallium, and zinc and has a carrier density less than $10^{18}/cm^3$ is disclosed (see Patent Document 1).

An oxide semiconductor layer can be formed by a sputtering method, and thus can be used for a transistor in a large-sized display device. Moreover, a transistor including an oxide semiconductor layer has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

It is known that a transistor including an oxide semiconductor layer has an extremely low leakage current when the transistor is off. For example, a CPU with low-power consumption utilizing low leakage current which is characteristic of the transistor including an oxide semiconductor layer is disclosed (see Patent Document 2).

REFERENCE

[Patent Document 1] Japanese Published Patent Application No. 2006-165528

[Patent Document 2] United States Patent Application Publication No. 2012/0032730

DISCLOSURE OF INVENTION

As application of a transistor including an oxide semiconductor layer becomes widespread, reliability has been requested from various aspects. Thus, it is an object of one embodiment of the present invention to obtain a transistor including an oxide semiconductor layer, which has stable electrical characteristics. It is another object thereof to provide a highly reliable semiconductor device including the transistor.

According to one embodiment of the present invention, a semiconductor device includes a multi-layer film including an oxide layer and an oxide semiconductor layer, a gate insulating film in contact with the multi-layer film, and a gate electrode overlapping with the multi-layer film with the gate insulating film provided therebetween. The oxide semiconductor layer contains indium. The oxide semiconductor layer is in contact with the oxide layer. The oxide layer contains indium and has a larger energy gap than the oxide semiconductor layer.

Note that typical examples of the oxide semiconductor layer or the oxide layer containing indium include an In—Ga oxide, an In—Zn oxide, and an In-M-Zn oxide (M is Al, Ti, Ga, Y, Zr, Sn, La, Ce, Nd, or Hf).

According to another embodiment of the present invention, a semiconductor device includes a multi-layer film including an oxide layer and an oxide semiconductor layer, a gate insulating film in contact with the multi-layer film, and a gate electrode overlapping with the multi-layer film with the gate insulating film provided therebetween. The oxide semiconductor layer contains indium. The oxide semiconductor layer is in contact with the oxide layer. The oxide layer contains indium. An energy at a bottom of a conduction band of the oxide layer is closer to a vacuum level than an energy at a bottom of a conduction band of the oxide semiconductor layer. Note that an energy gap between a vacuum level and a bottom of a conduction band is referred to as an electron affinity.

According to another embodiment of the present invention, a semiconductor device includes a multi-layer film including a first oxide layer, a second oxide layer, and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the first oxide layer. The first oxide layer contains indium and has a larger energy gap than the oxide semiconductor layer. The oxide semiconductor layer is in contact with the second oxide layer facing the first oxide layer. The second oxide layer contains indium and has a larger energy gap than the oxide semiconductor layer.

According to another embodiment of the present invention, a semiconductor device includes a multi-layer film including a first oxide layer, a second oxide layer, and an oxide semiconductor layer; a gate insulating film in contact with the multi-layer film; and a gate electrode overlapping with the multi-layer film with the gate insulating film provided therebetween. The oxide semiconductor layer contains indium. The oxide semiconductor layer is in contact with the first oxide layer. The first oxide layer contains indium. An energy at a bottom of a conduction band of the first oxide layer is closer to a vacuum level than an energy at a bottom of a conduction band of the oxide semiconductor layer. The oxide semiconductor layer is in contact with the second oxide layer facing the first oxide layer. The second oxide layer contains indium. An energy at a bottom of a conduction band of the second oxide layer is closer to the vacuum level than the energy at the bottom of the conduction band of the oxide semiconductor layer.

In order to obtain a transistor having stable electrical characteristics, where a channel is formed in the oxide semiconductor layer, it is effective to highly purify the oxide semiconductor layer to be a highly purified intrinsic oxide semiconductor layer by reducing the concentration of impurities in the oxide semiconductor layer. Obtaining a highly purified intrinsic oxide semiconductor layer refers to purifying or substantially purifying the oxide semiconductor layer to be an intrinsic or substantially intrinsic oxide semiconductor layer. Note that in the case of the substantially purified intrinsic oxide semiconductor layer, the carrier density thereof is lower than $1\times10^{17}/cm^3$, lower than $1\times10^{15}/cm^3$, or lower than $1\times10^{13}/cm^3$. In the oxide semiconductor layer, hydrogen, nitrogen, carbon, silicon, and a metal element other than the main component become an impurity and increase the carrier density in some cases. In order to reduce the concentration of impurities in the oxide semiconductor layer, it is preferable to also reduce the concentration of impurities in the first oxide layer and the third oxide layer which are close to the oxide semiconductor layer.

For example, silicon forms an impurity level in the oxide semiconductor layer. In some cases, the impurity level becomes a trap, which deteriorates electrical characteristics of a transistor. Specifically, the concentration of silicon in the oxide semiconductor layer is set to be lower than $1\times10^{19}$ atoms/$cm^3$, preferably lower than $5\times10^{18}$ atoms/$cm^3$, more preferably lower than $1\times10^{18}$ atoms/$cm^3$. Note that as the gate insulating film of the transistor, an insulating film containing silicon such as a silicon oxide film, a silicon oxynitride film, a silicon nitride film, or a silicon nitride oxide film is used in many cases; therefore, it is preferable that the oxide semiconductor layer be not in contact with the gate insulating film.

Further, hydrogen and nitrogen in the oxide semiconductor layer faun donor levels, which increase carrier density.

In the case where a channel is formed at the interface between a gate insulating film and an oxide semiconductor layer, interface scattering occurs at the interface, whereby the field-effect mobility of a transistor is reduced. In view of the above, it is preferable that the oxide semiconductor layer be not formed in contact with the gate insulating film and that a channel be separate from the gate insulating film.

Thus, when the channel of the transistor is separate from the gate insulating film, the transistor can have stable electrical characteristics and a high field-effect mobility. With the use of the transistor as a switching element of a display device, a highly reliable display device can be obtained because the transistor has stable electrical characteristics.

In order to form the channel of the transistor separately from the gate insulating film, the multi-layer film including the oxide semiconductor layer can have the following structure, for example Note that the oxide semiconductor layer preferably contains at least indium because carrier mobility can be increased.

The multi-layer film including the oxide semiconductor layer includes at least the oxide semiconductor layer (for convenience, referred to as a second oxide layer) and the first oxide layer (also referred to as a barrier layer) between the second oxide layer and the gate insulating film. The first oxide layer includes one or more elements other than oxygen included in the second oxide layer. In addition, the energy at the bottom of the conduction band of the first oxide layer is closer to a vacuum level than that of the second oxide layer by 0.05 eV or more, 0.07 eV or more, 0.1 eV or more, or 0.15 eV or more and 2 eV or less, 1 eV or less, 0.5 eV or less, or 0.4 eV or less. When an electric field is applied to the gate electrode at this time, a channel is formed in the second oxide layer of the multi-layer film including the oxide semiconductor layer, whose energy at the bottom of the conduction band is low. That is, the first oxide layer is formed between the second oxide layer and the gate insulating film, whereby a channel of the transistor can be formed in a layer which is not in contact with the gate insulating film (here, the second oxide layer). Further, since the first oxide layer includes one or more elements other than oxygen included in the second oxide layer, interface scattering is unlikely to occur at the interface between the second oxide layer and the first oxide layer. Thus, the transistor can have a high field-effect mobility because the movement of carriers is not hindered at the interface.

The first oxide layer may contain, for example, aluminum, silicon, titanium, gallium, germanium, yttrium, zirconium, tin, lanthanum, cerium, or hafnium at a higher atomic ratio than the second oxide layer. Specifically, the amount of any of the above elements in the first oxide layer in an atomic ratio is 1.5 times or more, preferably 2 times or more, more preferably 3 times or more as much as that in the second oxide layer in an atomic ratio. Any of the above elements is strongly bonded to oxygen and thus has a function of suppressing generation of an oxygen vacancy in the first oxide layer. That is, an oxygen vacancy is more unlikely to be generated in the first oxide layer than in the second oxide layer.

Alternatively, when each of the first oxide layer and the second oxide layer is an In-M-Zn oxide and the first oxide layer and the second oxide layer contain In, M, and Zn in an atomic ratio of $x_1:y_1:z_1$ and an atomic ratio of $x_2:y_2:z_2$, respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the first oxide layer and the second oxide layer in which $y_1/x_1$ is 1.5 times or more as large as $y_2/x_2$ are selected. More preferably, the first oxide layer and the second oxide layer in which $y_1/x_1$ is 2 times or more as large as $y_2/x_2$ are selected. Further preferably, the first oxide layer and the second oxide layer in which $y_1/x_1$ is 3 times or more as large as $y_2/x_2$ are selected. In the second oxide layer at this time, $y_1$ is preferably larger than or equal to $x_1$ because the transistor can have stable electrical characteristics. However, when $y_1$ is 3 times or more as large as $x_1$, the field-effect mobility of the transistor is reduced; accordingly, $y_1$ is preferably equal to $x_1$ or smaller than 3 times $x_1$.

The thickness of the first oxide layer is greater than or equal to 3 nm and less than or equal to 100 nm, preferably greater than or equal to 3 nm and less than or equal to 50 nm. The thickness of the second oxide layer is greater than or equal to 3 nm and less than or equal to 200 nm, preferably greater than or equal to 3 nm and less than or equal to 100 nm, more preferably greater than or equal to 3 nm and less than or equal to 50 nm.

Alternatively, the multi-layer film including the oxide semiconductor layer may include a third oxide layer (also referred to as a barrier layer) facing the gate insulating film, which is in contact with an insulating film and the second oxide layer. The third oxide layer includes one or more elements other than oxygen included in the second oxide layer. In addition, the energy at the bottom of the conduction band of the third oxide layer is closer to a vacuum level than that of the second oxide layer by 0.05 eV or more, 0.07 eV or more, 0.1 eV or more, or 0.15 eV or more and 2 eV or less, 1 eV or less, 0.5 eV or less, or 0.4 eV or less. When an electric field is applied to the gate electrode at this time, a channel is not formed in the third oxide layer. Further, since the third oxide layer includes one or more elements other than oxygen included in the second oxide layer, an interface level is unlikely to be formed at the interface between the second oxide layer and the third oxide layer. When the interface has an interface level, in some cases, a second transistor in which the interface serves as a channel and which has a different threshold voltage is formed; accordingly, the apparent threshold voltage of the transistor is changed. Thus, with the third oxide layer, fluctuation in electrical characteristics of the transistors, such as a threshold voltage, can be reduced. Note that in the case where the third oxide layer is included, in some cases, the multi-layer film including the oxide semiconductor layer does not need to include the first oxide layer.

The third oxide layer may contain, for example, aluminum, silicon, titanium, gallium, germanium, yttrium, zirconium, tin, lanthanum, cerium, or hafnium at a higher atomic ratio than the second oxide layer. Specifically, the amount of any of the above elements in the third oxide layer in an atomic ratio is 1.5 times or more, preferably 2 times or more, more preferably 3 times or more as much as that in the second oxide layer in an atomic ratio. Any of the above elements is strongly bonded to oxygen and thus has a function of suppressing generation of an oxygen vacancy in the third oxide layer. That is, an oxygen vacancy is more unlikely to be generated in the third oxide layer than in the second oxide layer.

Further alternatively, when each of the second oxide layer and the third oxide layer is an In-M-Zn oxide and the second oxide layer and the third oxide layer contain In, M, and Zn in an atomic ratio of $x_2:y_2:z_2$ and an atomic ratio of $x_3:y_3:z_3$, respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the second oxide layer and the third oxide layer in which $y_3/x_3$ is 1.5 times or more as large as $y_2/x_2$ are selected. More preferably, the second oxide layer and the third oxide layer in which $y_3/x_3$ is 2 times or more as large as $y_2/x_2$ are selected. Further preferably, the second oxide layer and the third oxide layer in which $y_3/x_3$ is 3 times or more as large as $y_2/x_2$ are selected. In the second oxide layer at this time, $y_2$ is preferably larger than or equal to $x_2$ because the transistor can have stable electrical characteristics. However, when $y_2$ is 3 times or more as large as $x_2$, the field-effect mobility of the transistor is reduced; accordingly, $y_2$ is preferably equal to $x_2$ or smaller than 3 times $x_2$.

The thickness of the third oxide layer is greater than or equal to 3 nm and less than or equal to 100 nm, preferably greater than or equal to 3 nm and less than or equal to 50 nm.

Note that the first oxide layer or the third oxide layer is provided in contact with a source electrode (a source region) and a drain electrode (a drain region) of the transistor.

When the source electrode (the source region) and the drain electrode (the drain region) of the transistor are provided in contact with at least side edges of the oxide semiconductor layer, the source electrode (the source region) and the drain electrode (the drain region) are in contact with a channel formation region, which is preferable.

According to one embodiment of the present invention, it is possible to obtain a transistor having stable electrical characteristics with a multi-layer film including an oxide semiconductor layer. In addition, it is possible to provide a highly reliable semiconductor device including the transistor.

BRIEF DESCRIPTION OF DRAWINGS

FIG. 4 shows the number of particles in an oxide layer and an oxide semiconductor layer of one embodiment of the present invention.

FIGS. 15A to 15C are cross-sectional views illustrating an example of a film formation chamber and the like.

BEST MODE FOR CARRYING OUT THE INVENTION

Figure 1:
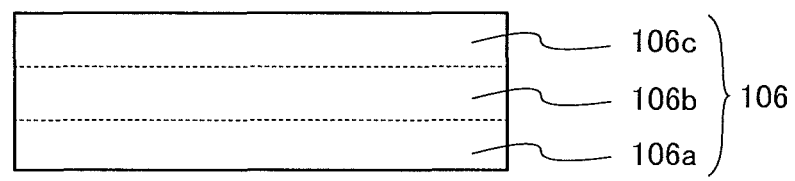
FIG. 1 is a cross-sectional view illustrating a multi-layer film of one embodiment of the present invention.

One embodiment of the present invention will be described below in detail with reference to the accompanying drawings. However, the present invention is not limited to the following description and it is easily understood by those skilled in the art that the mode and details can be variously changed. In addition, the present invention should not be construed as being limited to the description in the following embodiment. In describing structures of the present invention with reference to the drawings, the same reference numerals are used in common for the same portions in different drawings. Note that the same hatch pattern is applied to similar parts, and in some cases the similar parts are not especially denoted by reference numerals.

Further, the ordinal numbers such as "first" and "second" in this specification are used for convenience and do not indicate the order of steps or the stacking order of layers. In addition, the ordinal numbers in this specification do not indicate particular names which specify the present invention.

Note that in many cases, a voltage refers to a potential difference between a certain potential and a reference potential (e.g., a ground potential (GND) or a source potential). Accordingly, a voltage can also be called a potential.

Even when the expression "to be electrically connected" is used, there is a case in which no physical connection is made and a wiring is just extended in an actual circuit.

Further, functions of a source and a drain might be switched when a direction of current flow is changed in circuit operation, for example. Therefore, the terms "source" and "drain" can be switched in this specification.

The descriptions in this embodiment can be combined with each other as appropriate.

<1. Multi-Layer Film Including Oxide Semiconductor Layer>

A multi-layer film including an oxide semiconductor layer used for a transistor is described with reference to FIG. 1.

<1-1. Structure of Multi-Layer Film>

In this section, the structure of the multi-layer film is described.

A multi-layer film 106 illustrated in FIG. 1 includes an oxide layer 106a, an oxide semiconductor layer 106b over the oxide layer 106a, and an oxide layer 106c over the oxide semiconductor layer 106b. Note that although the multi-layer film 106 has three layers in the description below, the multi-layer film 106 may have two layers or four or more layers. For example, the multi-layer film 106 may be a two-layer film including the oxide layer 106a and the oxide semiconductor layer 106b over the oxide layer 106a. Alternatively, the multi-layer film 106 may be a two-layer film including the oxide semiconductor layer 106b and the oxide layer 106c over the oxide semiconductor layer 106b.

<1-2. Composition and Impurities>

In this section, the concentrations of silicon in the layers included in the multi-layer film 106 are described with reference to FIG. 2.

Here, the oxide layer 106a was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

The oxide semiconductor layer 106b was formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set at 0.4 Pa, the substrate temperature was set at 300° C., and a DC power of 0.5 kW was applied.

The oxide layer 106c was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

The multi-layer film 106 is provided over a silicon wafer, and a sample not subjected to heat treatment and a sample subjected to heat treatment at 450° C. for two hours are prepared. FIG. 2 shows the secondary ion intensities of In, Ga, and Zn in a depth direction, and the silicon concentration (atoms/cm$^3$) in a depth direction, which is converted from the secondary ion intensity of SiO$_3$, of the samples measured by ToF-SIMS (Time-of-flight secondary ion mass spectrometry). The multi-layer film 106 includes the oxide layer 106a having a thickness of 10 nm, the oxide semiconductor layer 106b having a thickness of 10 nm over the oxide layer 106a, and the oxide layer 106c having a thickness of 10 nm over the oxide semiconductor layer 106b.

Figure 2:
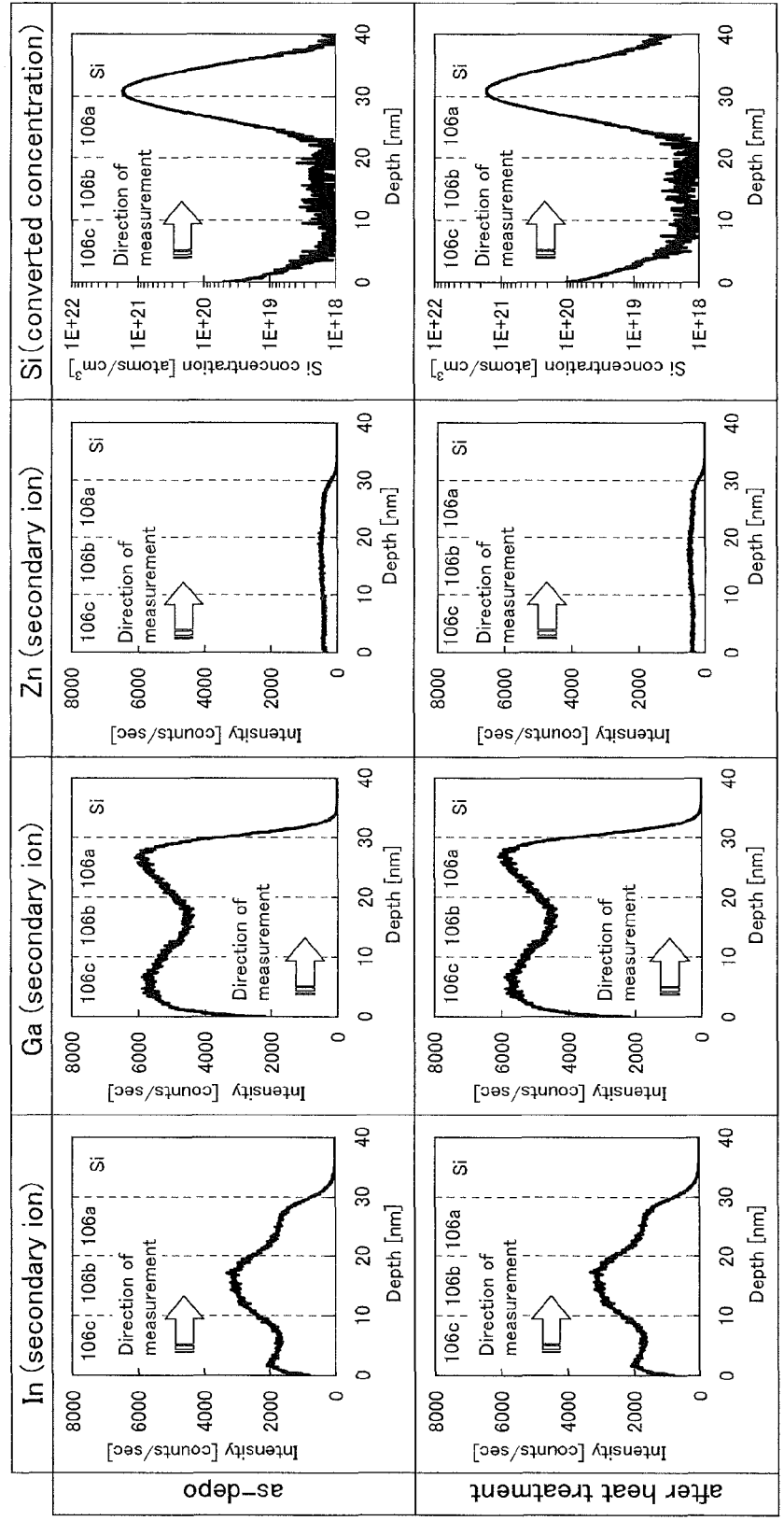
FIG. 2 shows ToF-SIMS results of a multi-layer film of one embodiment of the present invention.

FIG. 2 shows that the compositions of the layers included in the multi-layer film 106 are changed depending on the compositions of the respective targets used at the time of the film formation. Note that the compositions of the layers cannot be simply compared using FIG. 2.

FIG. 2 indicates that the interface between the silicon wafer and the oxide layer 106a of the multi-layer film 106 and the upper surface of the oxide layer 106c have higher silicon concentrations. Moreover, FIG. 2 shows that the concentration of silicon in the oxide semiconductor layer 106b is about 1×10$^{18}$ atoms/cm$^3$ which is the lower limit of detection by Tof-SIMS. This is probably because, owing to existence of the oxide layers 106a and 106c, the oxide semiconductor layer 106b is not influenced by silicon due to the silicon wafer or the surface contamination.

Further, comparison of the sample after the heat treatment with an as-deposited sample (the sample not subjected to heat treatment, referred to as "as-depo" in FIG. 2) indicates that entry of silicon mainly occurs at the time of the film formation, though there is a small effect of silicon diffusion through the heat treatment.

It is effective to highly purify the oxide semiconductor layer 106b to be a highly purified intrinsic oxide semiconductor layer so that a transistor including the multi-layer film 106 has stable electrical characteristics. Specifically, the carrier density of the oxide semiconductor layer 106b can be set to be lower than 1×10$^{17}$/cm$^3$, lower than 1×10$^{15}$/cm$^3$, or lower than 1×10$^{13}$/cm$^3$. In the oxide semiconductor layer 106b, hydrogen, nitrogen, carbon, silicon, and a metal element other than the main component become an impurity. In order to reduce the concentration of impurities in the oxide semiconductor layer 106b, it is preferable to also reduce the concentration of impurities in the oxide layers 106a and 106c which are close to the oxide semiconductor layer 106b to a value almost equal to that in the oxide semiconductor layer 106b.

Particularly when silicon is contained in the oxide semiconductor layer 106b at a high concentration, an impurity level due to silicon is formed in the oxide semiconductor layer 106b. In some cases, the impurity level becomes a trap, which deteriorates electrical characteristics of the transistor. In order to make the deterioration of the electrical characteristics of the transistor small, the concentration of silicon in the oxide semiconductor layer 106b can be set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Moreover, the concentrations of silicon at the interface between the oxide layer 106a and the oxide semiconductor layer 106b and the interface between the oxide semiconductor layer 106b and the oxide layer 106c are each set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$.

Further, hydrogen and nitrogen in the oxide semiconductor layer 106b form donor levels, which increase carrier density. In order to make the oxide semiconductor layer 106b intrinsic or substantially intrinsic, the concentration of hydrogen in the oxide semiconductor layer 106b, which is measured by SIMS, is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. The concentration of nitrogen in the oxide semiconductor layer 106b, which is measured by SIMS, is set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$.

Note that when silicon and carbon are contained in the oxide semiconductor layer 106b at a high concentration, the crystallinity of the oxide semiconductor layer 106b is lowered in some cases. In order not to lower the crystallinity of the oxide semiconductor layer 106b, the concentration of silicon in the oxide semiconductor layer 106b can be set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Moreover, in order not to lower the crystallinity of the oxide semiconductor layer 106b, the concentration of carbon in the oxide semiconductor layer 106b can be set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Description of the crystallinity of the multi-layer film 106 will be made later.

An oxygen vacancy in the oxide semiconductor layer and the oxide layer behaves in some cases like an impurity. Here, diffusion of oxygen in the multi-layer film 106 through heat treatment at 350° C. or heat treatment at 450° C. is described with reference to FIGS. 3A to 3C.

Figure 3A:
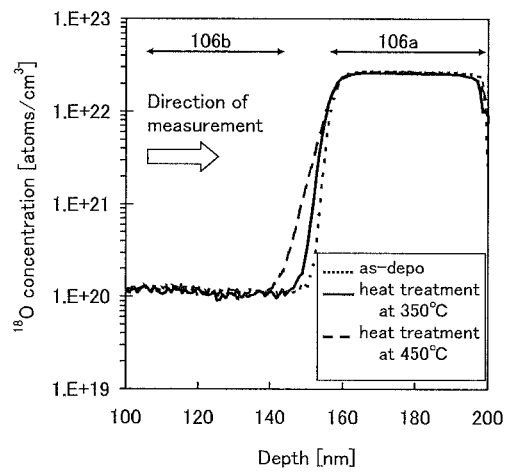
FIGS. 3A to 3C each show diffusion of oxygen in a multi-layer film of one embodiment of the present invention.
Figure 3B:
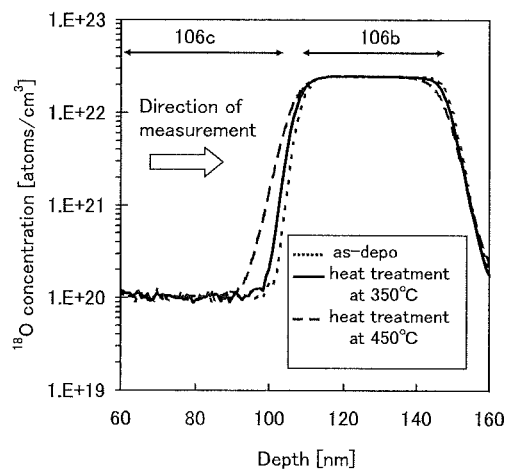
Figure 3C:
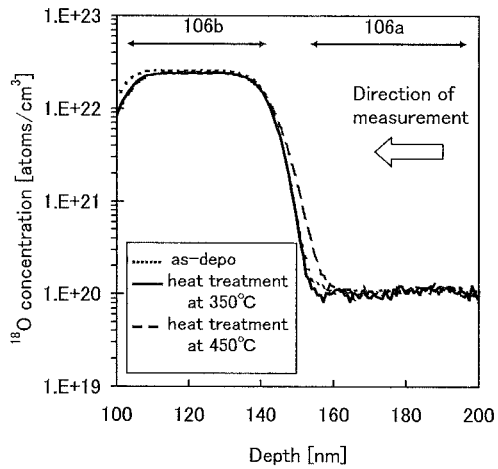

FIGS. 3A to 3C each show SIMS measurement results of concentration distribution of $^{18}$O in a depth direction in samples in which any of the layers of the multi-layer film 106 is formed using an $^{18}$O$_2$ gas.

Here, the oxide layer 106a is formed by a sputtering method using an In—Ga—Zn oxide (the atomic ratio of In to Ga and Zn is 1:1:1) target.

The oxide semiconductor layer 106b is formed by a sputtering method using an In—Ga—Zn oxide (the atomic ratio of In to Ga and Zn is 3:1:2) target.

The oxide layer 106c is formed by a sputtering method using an In—Ga—Zn oxide (the atomic ratio of In to Ga and Zn is 1:1:1) target.

Here, FIG. 3A shows $^{18}$O concentration distributions in a depth direction of the oxide layer 106a, the oxide semiconductor layer 106b, and the interface therebetween of samples in each of which an $^{18}$O$_2$ gas is used for forming the oxide layer 106a but an $^{18}$O$_2$ gas is not used for forming the other layers. The SIMS measurement results show as follows: $^{18}$O is more diffused from the oxide layer 106a to the oxide semiconductor layer 106b in a sample subjected to the heat treatment at 350° C. (shown as "after heat treatment at 350° C." with a solid line) and a sample subjected to the heat treatment at 450° C. (shown as "after heat treatment at 450° C." with a broken line) than in a sample not subjected to heat treatment (shown as "as-depo" with a dotted line).

FIG. 3B shows $^{18}$O concentration distributions in a depth direction of the oxide semiconductor layer 106b, the oxide layer 106c, and the interface therebetween of samples in each of which an $^{18}$O$_2$ gas is used for forming the oxide semiconductor layer 106b but an $^{18}$O$_2$ gas is not used for forming the other layers. The SIMS measurement results show as follows: $^{18}$O is more diffused from the oxide semiconductor layer 106b to the oxide layer 106c in a sample subjected to the heat treatment at 350° C. (shown as "after heat treatment at 350° C." with a solid line) and a sample subjected to the heat treatment at 450° C. (shown as "after heat treatment at 450° C." with a broken line) than in a sample not subjected to heat treatment (shown as "as-depo" with a dotted line).

FIG. 3C shows $^{18}$O concentration distributions in a depth direction of the oxide layer 106a, the oxide semiconductor layer 106b, and the interface therebetween of samples in each of which an $^{18}$O$_2$ gas is used for forming the oxide semiconductor layer 106b but an $^{18}$O$_2$ gas is not used for forming the other layers. The SIMS measurement results show as follows: $^{18}$O is more diffused from the oxide semiconductor layer 106b to the oxide layer 106a in a sample subjected to the heat treatment at 450° C. (shown as "after heat treatment at 450° C." with a broken line) than in a sample not subjected to heat treatment (shown as "as-depo" with a dotted line) and a sample subjected to the heat treatment at 350° C. (shown as "after heat treatment at 350° C." with a solid line).

As shown in FIGS. 3A to 3C, in the multi-layer film 106, oxygen is diffused from one layer to the other layer.

<1-3. Oxide Layer>

Next, an oxide layer applicable to each of the oxide layers 106a and 106c used in the multi-layer film 106 was formed by a sputtering method, and the number of particles with a size of 1 μm or more was measured.

The measurement was performed on the following samples: a sample formed using a gallium oxide target; a sample formed using a Ga—Zn oxide (the atomic ratio of Ga to Zn is 2:5) target; a sample formed using an In—Ga—Zn oxide (the atomic ratio of In to Ga and Zn is 3:1:2) target; a sample formed using an In—Ga—Zn oxide (the atomic ratio of In to Ga and Zn is 1:1:1) target; and a sample formed using an In—Ga—Zn oxide (the atomic ratio of In to Ga and Zn is 1:3:2) target.

FIG. 4 shows that in the sample formed using a gallium oxide target and the sample formed using a Ga—Zn oxide target, the number of particles with a size of 1 μm or more is rapidly increased as the thickness of the oxide layer is increased. On the other hand, in the samples formed using an In—Ga—Zn oxide target, the number of particles with a size of 1 μm or more is unlikely to be rapidly increased even when the thickness of the oxide layer is increased.

Thus, in the case where the oxide layer is formed by a sputtering method, a target containing indium is preferably used in terms of an increase in the number of particles. Moreover, it is preferable to use an oxide target in which the proportion of gallium in the atomic ratio of In to Ga and Zn is relatively small. Particularly in the case where a target containing indium is used, the conductivity of the target can be increased and DC discharge and AC discharge are facilitated; therefore, film formation over a large-sized substrate can be easily performed. Thus, semiconductor devices can be manufactured with improved productivity.

<1-4. Band Structure>

In this section, the band structure of the multi-layer film 106 is described with reference to FIGS. 5A and 5B and FIGS. 6A and 6B.

Note that the oxide layer 106a was formed using an In—Ga—Zn oxide having an energy gap of 3.15 eV, the oxide semiconductor layer 106b was formed using an In—Ga—Zn oxide having an energy gap of 2.8 eV, and the oxide layer 106c was formed using an oxide layer whose physical properties are similar to those of the oxide layer 106a. Further, the energy gap in the vicinity of the interface between the oxide layer 106a and the oxide semiconductor layer 106b and the energy gap in the vicinity of the interface between the oxide layer 106c and the oxide semiconductor layer 106b were each 3 eV. The energy gaps were measured using a spectroscopic ellipsometer (UT-300 manufactured by HORIBA JOBIN YVON SAS.). The thicknesses of the oxide layer 106a, the oxide semiconductor layer 106b, and the oxide layer 106c were each 10 nm.

Figure 5A:
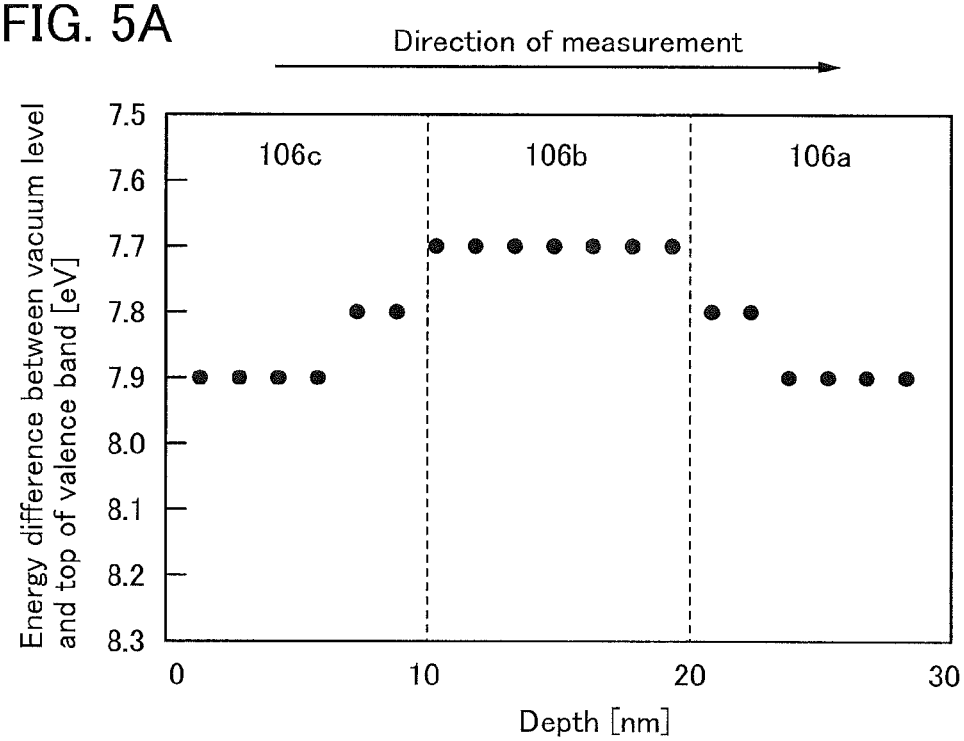
FIGS. 5A and 5B each show a band structure of a multi-layer film of one embodiment of the present invention.

In FIG. 5A, the energy gap between a vacuum level and a top of a valence band of each layer was measured while the multi-layer film 106 was etched from the oxide layer 106c side, and was plotted. The energy gap between the vacuum level and the top of the valence band was measured using an ultraviolet photoelectron spectroscopy (UPS) device (VersaProbe manufactured by ULVAC-PHI, Inc.).

Figure 5B:
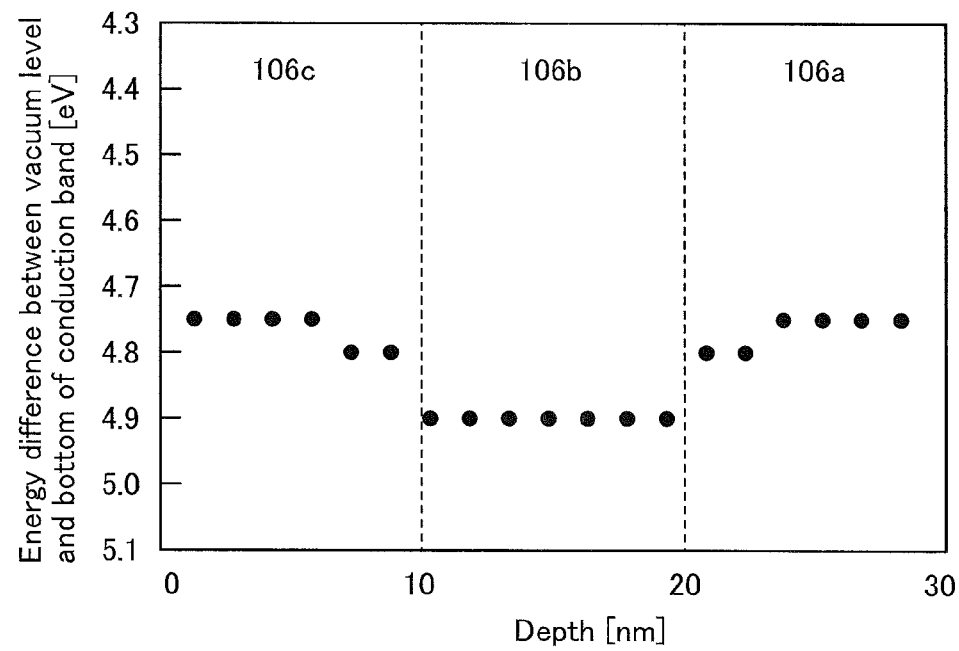

In FIG. 5B, a value obtained in such a manner that an energy gap between the vacuum level and a bottom of a conduction band of each layer was calculated by subtracting the energy gap of each layer from the energy gap between the vacuum level and the top of the valence band, and was plotted.

Figure 6A:
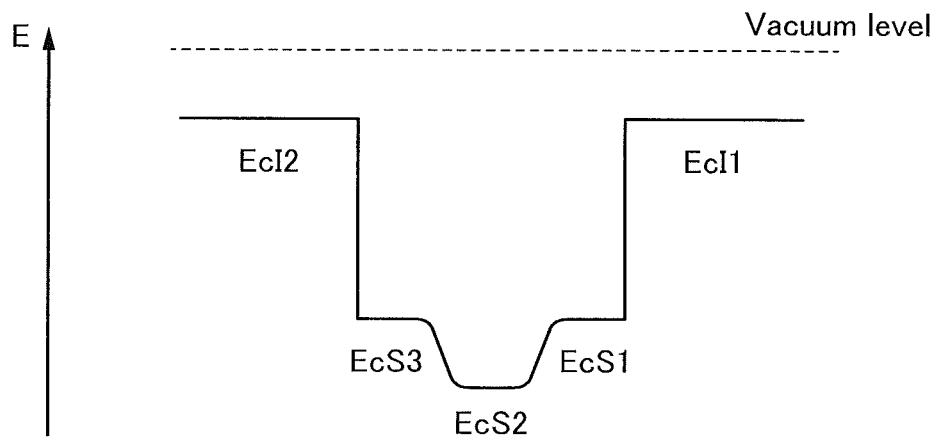
FIGS. 6A and 6B each illustrate a band structure of a multi-layer film of one embodiment of the present invention.
Figure 6B:
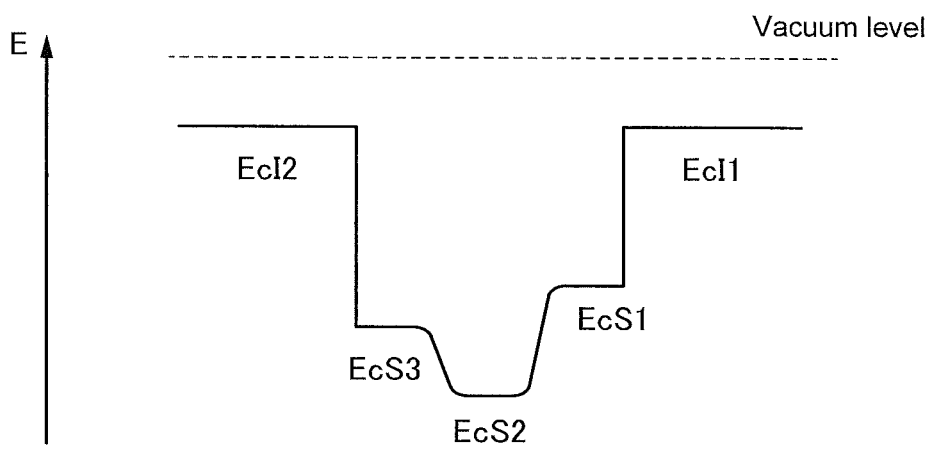

Part of the band structure in FIG. 5B is schematically shown in FIG. 6A. FIG. 6A shows the case where silicon oxide films are provided in contact with the oxide layers 106a and 106c. Here, EcI1 denotes the energy of the bottom of the conduction band of the silicon oxide film, EcS1 denotes the energy of the bottom of the conduction band of the oxide layer 106a, EcS2 denotes the energy of the bottom of the conduction band of the oxide semiconductor layer 106b, EcS3 denotes the energy of the bottom of the conduction band of the oxide layer 106c, and EcI2 denotes the energy of the bottom of the conduction band of the silicon oxide film.

As shown in FIG. 6A, the energies of the bottoms of the conduction bands of the oxide layer 106a, the oxide semiconductor layer 106b, and the oxide layer 106c are changed continuously. This can be understood also from the results shown in FIGS. 3A to 3C that oxygen is diffused at the interface between the oxide layer 106a and the oxide semiconductor layer 106b and at the interface between the oxide semiconductor layer 106b and the oxide layer 106c.

Note that FIG. 6A shows the case where the oxide layers 106a and 106c have similar physical properties; however, the oxide layers 106a and 106c may have different physical properties. For example, part of the band structure in the case where EcS1 has a higher energy than EcS3 is shown as in FIG. 6B. Alternatively, although not shown in FIGS. 6A and 6B, EcS3 may have a higher energy than EcS1.

According to FIGS. 5A and 5B and FIGS. 6A and 6B, the oxide semiconductor layer 106b of the multi-layer film 106 serves as a well and a channel of the transistor including the multi-layer film 106 is formed in the oxide semiconductor layer 106b. Note that since the energies of the bottoms of the conduction bands are changed continuously, the multi-layer film 106 can also be referred to as a U-shaped well.

Figure 7:
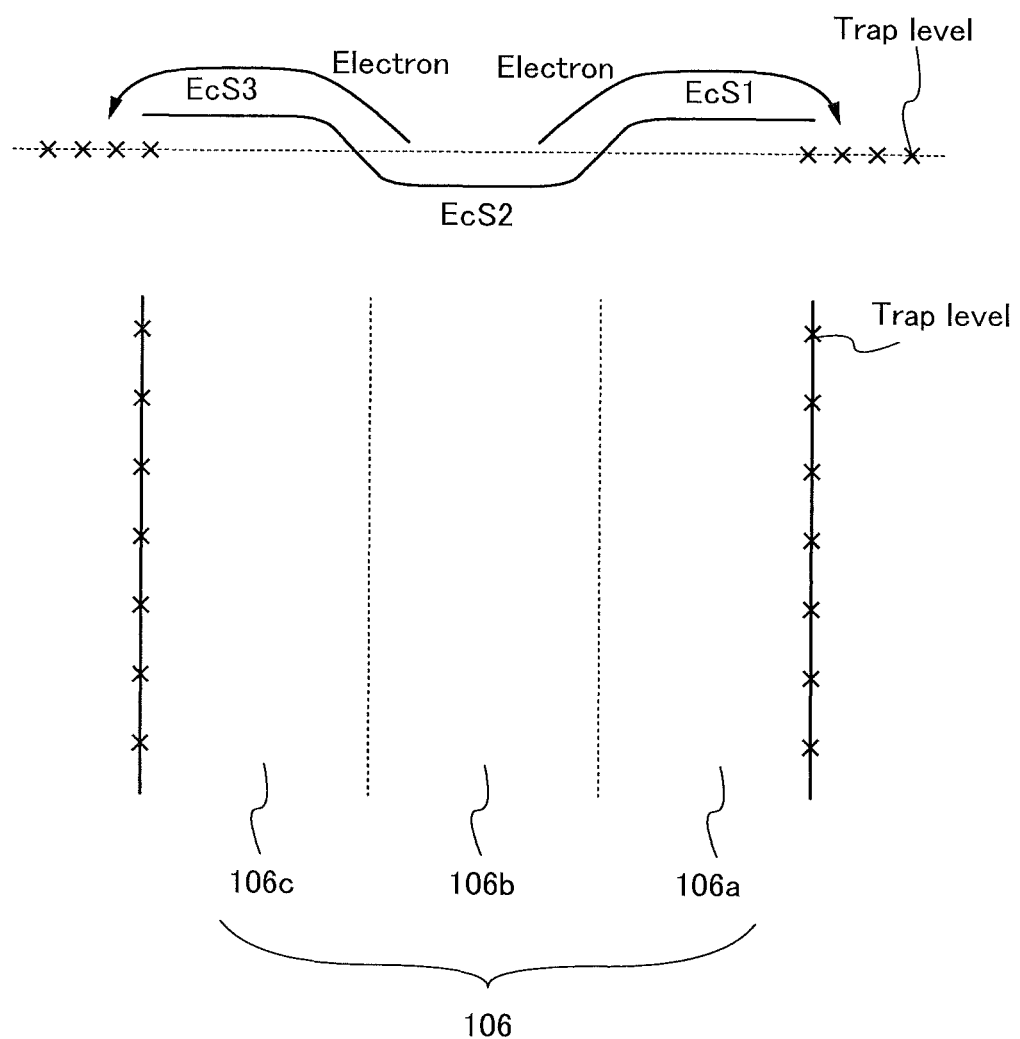
FIG. 7 shows a band structure of a multi-layer film of one embodiment of the present invention.

Note that although trap levels due to impurities or defects might be formed in the vicinity of the interface between an insulating film such as a silicon oxide film and each of the oxide layers 106a and 106c as shown in FIG. 7, the oxide semiconductor layer 106b can be distanced away from the trap levels owing to existence of the oxide layers 106a and 106c. However, when the energy gap between EcS1 or EcS3, and EcS2 is small, an electron might reach the trap level by passing over the energy gap. By being trapped in the trap level, a negative fixed charge is caused at the interface with the insulating film, whereby the threshold voltage of the transistor is shifted in the positive direction.

Thus, the energy gap between EcS1 and EcS2 and the energy gap between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

<1-5. Crystallinity>

It is preferable that at least the oxide semiconductor layer 106b of the multi-layer film 106 have crystallinity. With the oxide semiconductor layer 106b having crystallinity, the transistor including the multi-layer film 106 can have stable electrical characteristics as compared to the case of the oxide semiconductor layer 106b without crystallinity. In this section, an example in which the oxide semiconductor layer 106b has crystallinity in the multi-layer film 106 is described.

<1-5-1. Evaluation of Crystal Arrangement with TEM>

Here, as for the crystallinity of the multi-layer film 106, atomic arrangement or the like was evaluated with a transmission electron microscope (TEM). The description is made below with reference to FIGS. 8A to 8D and FIGS. 9A to 9D.

Here, the oxide layer 106a was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

The oxide semiconductor layer 106b was formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set at 0.4 Pa, the substrate temperature was set at 300° C. or 400° C., and a DC power of 0.5 kW was applied.

The oxide layer 106c was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

FIGS. 8A to 8D and FIGS. 9A to 9D are transmission electron images of samples each including the multi-layer film 106 provided over a silicon oxide film provided over a silicon wafer which is the substrate. Note that the evaluated samples shown in FIGS. 8A to 8D and the evaluated samples in FIGS. 9A to 9D are different from each other only in that the temperatures of the substrate at the time of the formation of the oxide semiconductor layer 106b are 300° C. (FIGS. 8A to 8D) and 400° C. (FIGS. 9A to 9D). Note that each sample was not subjected to heat treatment after the film formation. The transmission electron images were measured using Hitachi H-9500 transmission electron microscope (TEM).

Figure 8A:
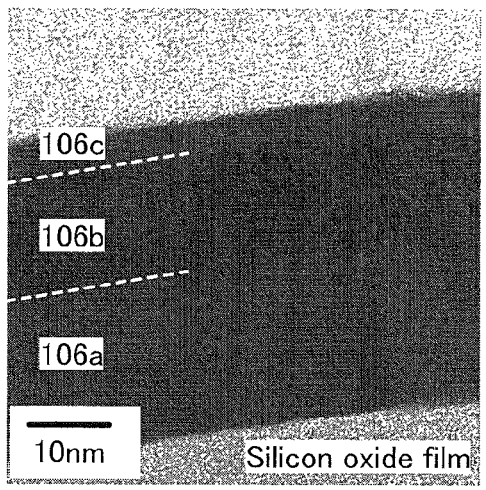
FIGS. 8A to 8D are each a transmission electron image of a multi-layer film of one embodiment of the present invention, which is obtained with a TEM.
Figure 8C:
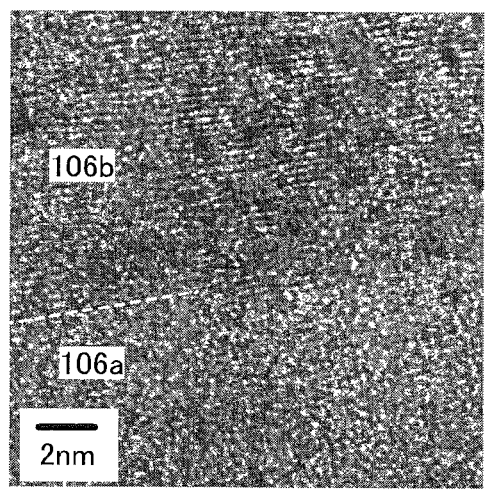
Figure 8B:
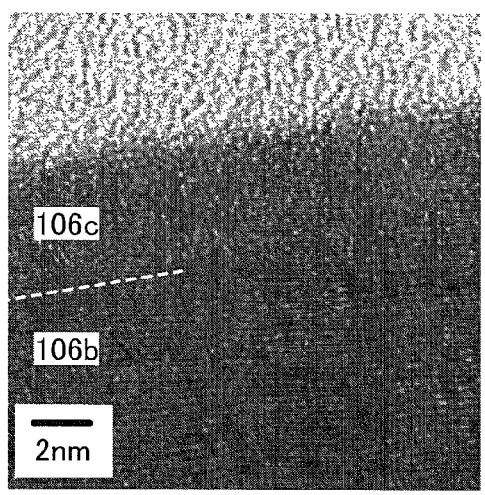
Figure 8D:
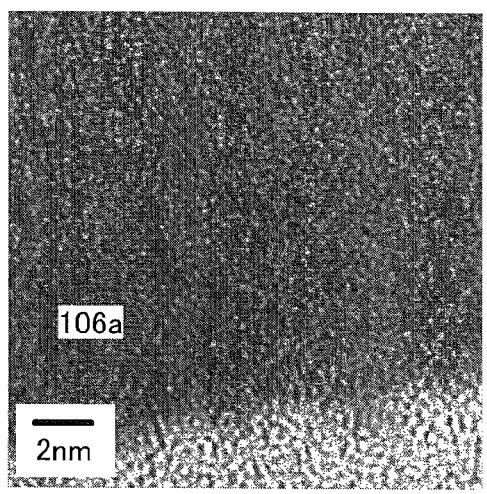
Figure 9A:
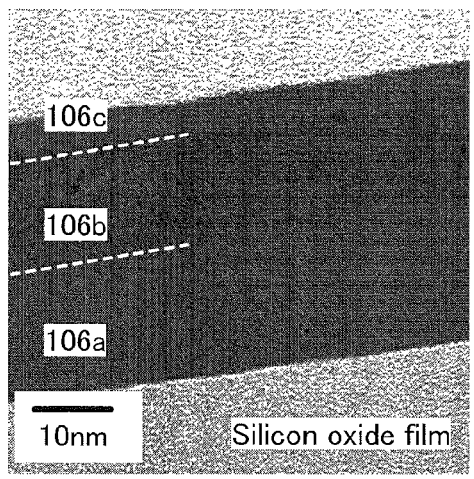
FIGS. 9A to 9D are each a transmission electron image of a multi-layer film of one embodiment of the present invention, which is obtained with a TEM.
Figure 9C:
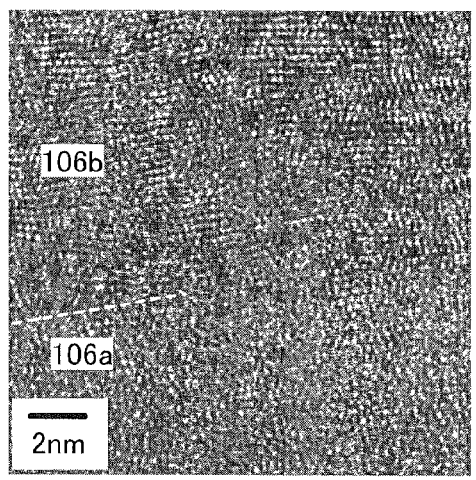
Figure 9B:
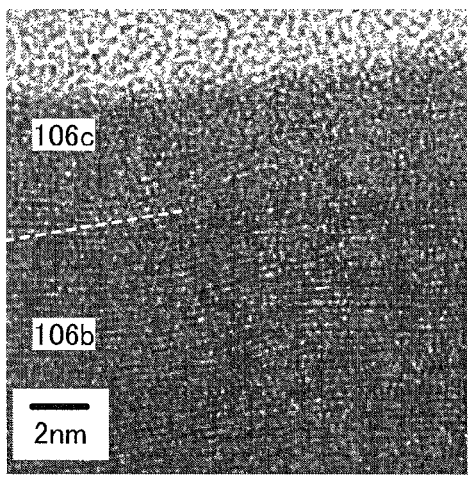
Figure 9D:
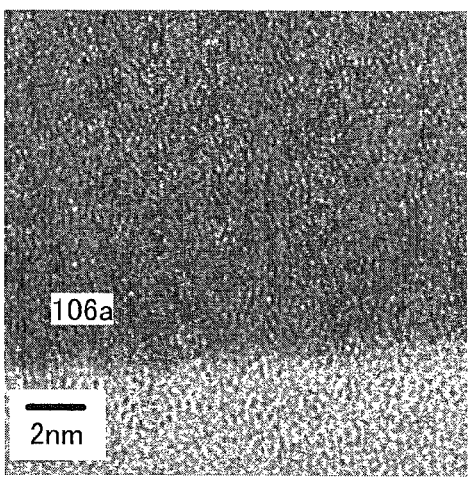

Here, the multi-layer film 106 includes an In—Ga—Zn oxide having a thickness of 20 nm as the oxide layer 106a, an In—Ga—Zn oxide having a thickness of 15 nm as the oxide semiconductor layer 106b, and an In—Ga—Zn oxide having a thickness of 5 nm as the oxide layer 106c. FIG. 8A is a transmission electron image including the oxide layer 106a, the oxide semiconductor layer 106b, and the oxide layer 106c. FIG. 8B is an enlarged image of a portion in the vicinity of the interface between the oxide semiconductor layer 106b and the oxide layer 106c, FIG. 8C is an enlarged image of a portion in the vicinity of the interface between the oxide layer 106a and the oxide semiconductor layer 106b, and FIG. 8D is an enlarged image of a portion in the vicinity of the interface between the silicon oxide film and the oxide layer 106a. In a similar manner, FIG. 9A is a transmission electron image including the oxide layer 106a, the oxide semiconductor layer 106b, and the oxide layer 106c. FIG. 9B is an enlarged image of a portion in the vicinity of the interface between the oxide semiconductor layer 106b and the oxide layer 106c, FIG. 9C is an enlarged image of a portion in the vicinity of the interface between the oxide layer 106a and the oxide semiconductor layer 106b, and FIG. 9D is an enlarged image of a portion in the vicinity of the interface between the silicon oxide film and the oxide layer 106a.

According to FIGS. 8A to 8D and FIGS. 9A to 9D, the oxide layers 106a and 106c did not have a clear crystal part. Further, the oxide semiconductor layer 106b was entirely crystalline with a high degree of crystallinity from the interface with the oxide layer 106a to the interface with the oxide layer 106c. Note that the atomic arrangement in the crystal part of the oxide semiconductor layer 106b was found to be in a layered manner in a plane parallel to the upper surface of the oxide semiconductor layer 106b. Moreover, a clear grain boundary was not seen between crystal parts in the oxide semiconductor layer 106b. Further, it was found that the oxide semiconductor layer 106b in FIGS. 9A to 9D had a higher degree of crystallinity than the oxide semiconductor layer 106b in FIGS. 8A to 8D.

The fact that the oxide semiconductor layer 106b was crystalline is also compatible with the ToF-SIMS results shown in FIG. 2. That is, the crystallinity of the oxide semiconductor layer 106b was not lowered probably because entry of silicon into the oxide semiconductor layer 106b was reduced owing to existence of the oxide layers 106a and 106c.

In this manner, it seems that the oxide semiconductor layer 106b where a channel is formed has a high degree of crystallinity and there are few levels due to impurities or defects; therefore, the transistor including the multi-layer film 106 has stable electrical characteristics.

<1-5-2. Crystal Growth Model>

Here, the model of crystal growth in the oxide semiconductor layer 106b with a high degree of crystallinity is described with reference to FIGS. 10A and 10B, FIGS. 11A and 11B, and FIGS. 12A and 12B.

Figures 10A, 10B:
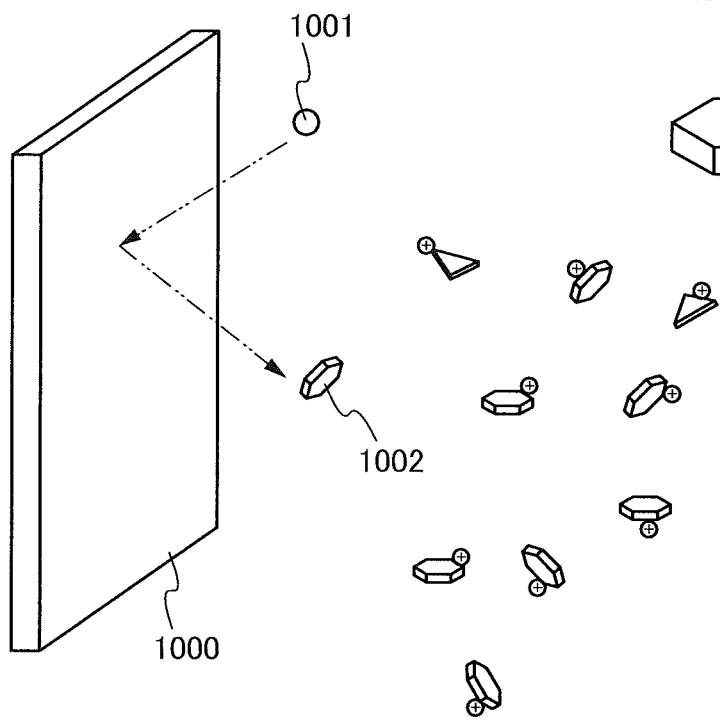
FIGS. 10A and 10B illustrate a state in which a sputtered particle is separated from a target.

FIG. 10A is a schematic diagram illustrating a state in which an ion 1001 collides with a target 1000 containing a polycrystalline oxide semiconductor having high alignment to separate sputtered particles 1002 with crystallinity from the sputtering target 1000. A crystal grain has a cleavage plane parallel to a surface of the target 1000. In addition, the crystal grain has a portion where an interatomic bond is weak. When the ion 1001 collides with the crystal grain, an interatomic bond of the portion where an interatomic bond is weak is cut. Accordingly, the sputtered particle 1002 which is cut along the cleavage plane and the portion where an interatomic bond is weak and separated in a flat-plate (or pellet) form is generated. Note that the equivalent circle diameter of a flat plane of the sputtered particle 1002 is greater than or equal to $\frac{1}{3000}$ and less than or equal to $\frac{1}{20}$, preferably greater than or equal to $\frac{1}{1000}$ and less than or equal to $\frac{1}{30}$ of an average grain size of the crystal grains. Here, the term "equivalent circle diameter of a plane" refers to the diameter of a perfect circle having the same area as the plane.

Alternatively, when part of the crystal grain is separated as a particle from a cleavage plane and exposed to plasma, cutting of a bond starts at the portion where an interatomic bond is weak, so that a plurality of sputtered particles 1002 are generated.

With the use of an oxygen cation as the ion 1001, plasma damage at the time of the film formation can be alleviated. Thus, when the ion 1001 collides with the surface of the target 1000, a lowering in crystallinity of the target 1000 can be suppressed or a change of the target 1000 into an amorphous state can be suppressed.

Figure 11A:
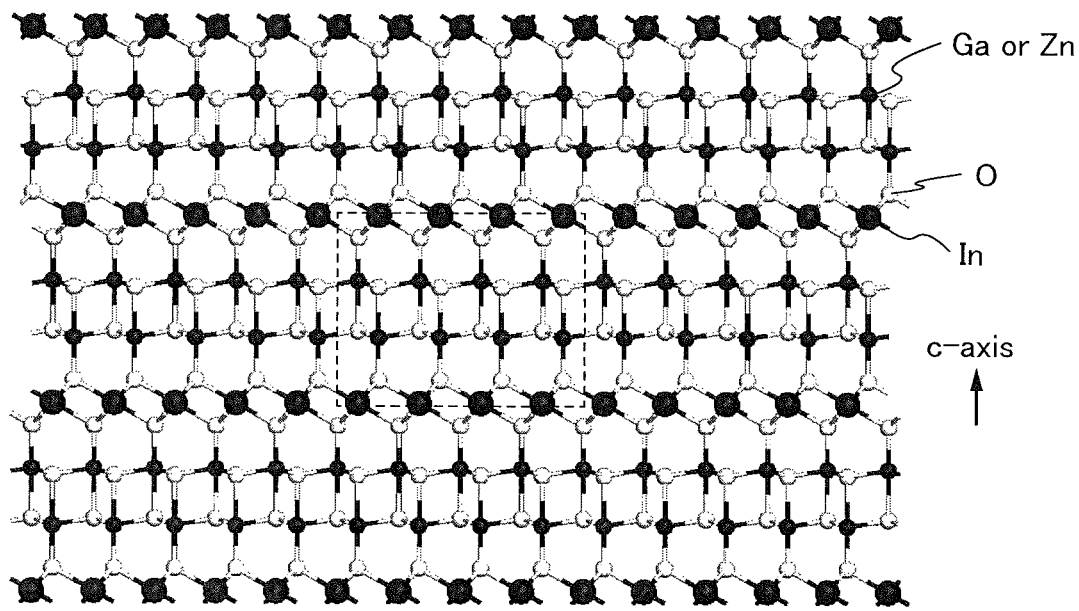
FIGS. 11A and 11B illustrate an example of a crystal structure of an In—Ga—Zn oxide.
Figure 11B:
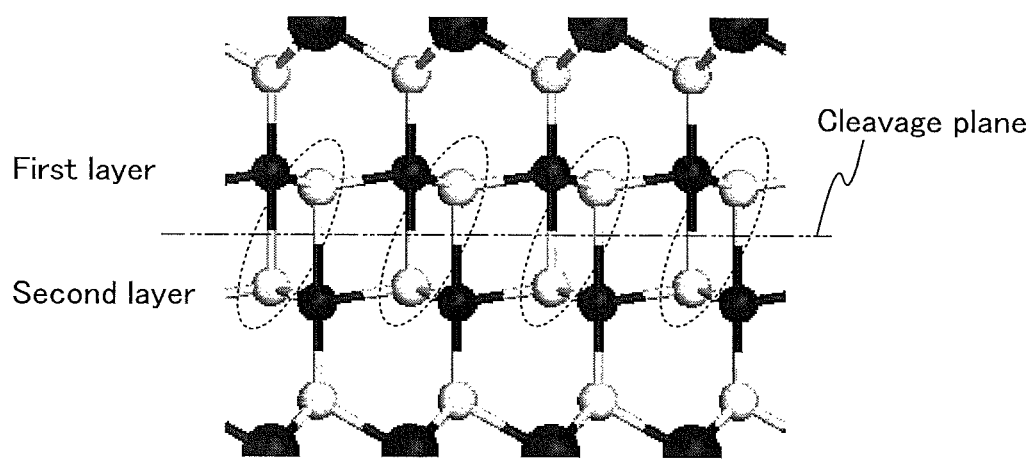

FIG. 11A illustrates a crystal structure of an In—Ga—Zn oxide viewed from a direction parallel to an a-b plane of the crystal as an example of the target 1000 containing a polycrystalline oxide semiconductor with a high orientation. FIG. 11B illustrates an enlarged view of a portion surrounded by a dashed line in FIG. 11A.

For example, in a crystal grain of an In—Ga—Zn oxide, a cleavage plane is a plane between a first layer and a second layer as illustrated in FIG. 11B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 11B). In this manner, the cleavage plane is parallel to the a-b plane. Further, the crystal of the In—Ga—Zn oxide shown in FIGS. 11A and 11B is a hexagonal crystal; thus, the flat plate-like crystal grain is likely to have a hexagonal prism shape with a regular hexagonal plane whose internal angle is 120°.

It is preferable that the separated sputtered particles 1002 be positively charged. There is no particular limitation on a timing of when the sputtered particle 1002 is positively charged, but it is preferable that the sputtered particle 1002 is positively charged by receiving an electric charge when the ion 1001 collides. Alternatively, in the case where plasma is generated, the sputtered particle 1002 is preferably exposed to plasma to be positively charged. Further alternatively, the ion 1001 which is an oxygen cation is preferably bonded to a side surface, a top surface, or a bottom surface of the sputtered particle 1002, whereby the sputtered particle 1002 is positively charged.

A state in which sputtered particles are deposited on a deposition surface is described below with reference to FIGS. 12A and 12B. Note that in FIGS. 12A and 12B, sputtered particles which have been already deposited are shown by dotted lines.

Figure 12A:
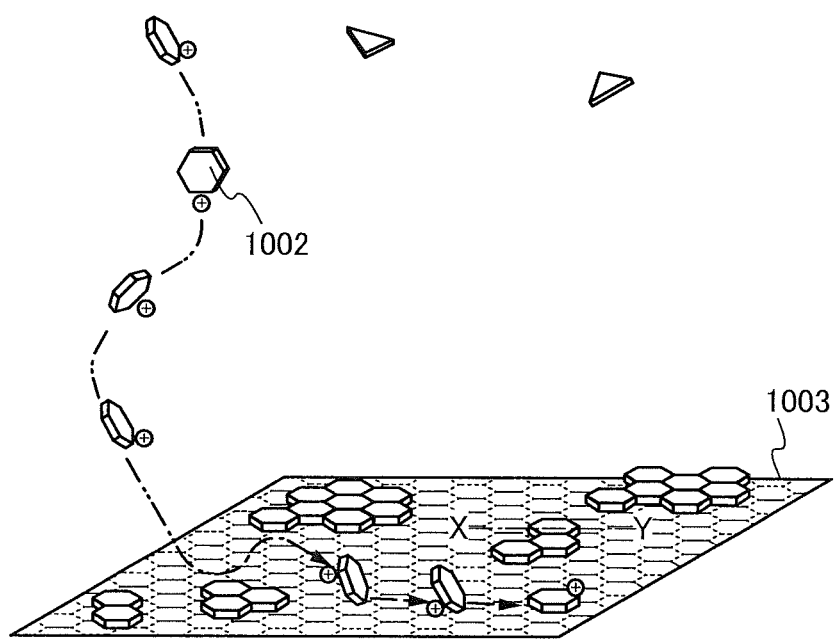
FIGS. 12A and 12B are schematic diagrams illustrating a state in which a sputtered particle reaches a deposition surface and is deposited.

In FIG. 12A, a deposition surface 1003 is a surface where several oxide semiconductor layers are deposited. As illustrated in FIG. 12A, in the case where the sputtered particles 1002 are positively charged, the sputtered particles 1002 are deposited in a region of the deposition surface 1003, where no sputtered particle 1002 has been deposited yet. This is because the sputtered particles 1002 which are positively charged repel with each other.

Figure 12B:
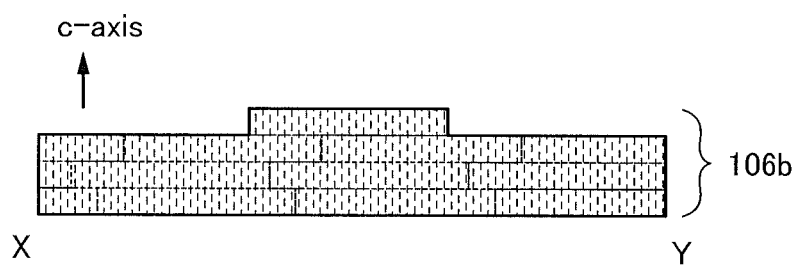

FIG. 12B is a cross-sectional view taken along dashed-dotted line X-Y in FIG. 12A. The sputtered particles 1002 which are deposited in the above manner have crystals whose c-axes are aligned in a direction perpendicular to the deposition surface 1003; accordingly, the oxide semiconductor layer 106b is a c-axis aligned crystalline oxide semiconductor (CAAC-OS) layer.

An oxide semiconductor layer which is obtained by deposition in the above manner has a uniform thickness and a uniform crystal orientation. The sputtered particles are not deposited randomly. The sputtered particles which are positively charged interact with each other and are deposited orderly so that c-axes are aligned in a direction perpendicular to the deposition surface.

With the use of the target containing a polycrystalline oxide semiconductor with a high orientation in the above manner, the oxide semiconductor layer 106b having a uniform thickness and a uniform crystal orientation can be formed. The details of a sputtering apparatus will be described later.

The CAAC-OS layer is one of oxide semiconductor films including a plurality of crystal parts, and most of the crystal part each fits inside a cube whose one side is less than 100 nm. Thus, there is a case where a crystal part included in the CAAC-OS layer fits inside a cube whose one side is less than 10 nm, less than 5 nm, or less than 3 nm. The density of defect states of the CAAC-OS layer is low. The CAAC-OS layer is described in detail below.

In a TEM image of the CAAC-OS film, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depending on regions.

Note that when the CAAC-OS layer with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appears at around 31° and a peak of 2θ do not appear at around 36°.

In a transistor using the CAAC-OS layer, change in electrical characteristics due to irradiation with visible light or ultraviolet light is small. Thus, the transistor has high reliability.

<1-6. Localized Level Density>

By reducing the density of the localized level of the multi-layer film 106, the transistor including the multi-layer film 106 can have stable electrical characteristics. In this section, the density of the localized level of the multi-layer film 106 was measured by a constant photocurrent method (CPM).

In order that the transistor has stable electrical characteristics, the absorption coefficient due to the localized level of the multi-layer film 106 measured by CPM is preferably lower than $1 \times 10^{-3}$ cm$^{-1}$, more preferably lower than $3 \times 10^{-4}$ cm$^{-1}$.

A sample on which CPM measurement was performed will be described below.

The oxide layer 106a was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

The oxide semiconductor layer 106b was formed by a sputtering method using an In—Ga—Zn oxide (the atomic ratio of In to Ga and Zn is 1:1:1) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

The oxide layer 106c was formed by a sputtering method using an In—Ga—Zn oxide (the atomic ratio of In to Ga and Zn is 1:3:2) target. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

Here, in order to improve the accuracy of the CPM measurement, the multi-layer film 106 needs to have a certain thickness. Specifically, the thicknesses of the oxide layer 106a, the oxide semiconductor layer 106b, and the oxide layer 106c which are included in the multi-layer film 106 were set at 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the multi-layer film 106 that is the sample, and then an absorption coefficient is derived from the amount of the irradiation light at each wavelength. In the CPM measurement, when the sample has a defect, the absorption coefficient due to the energy which corresponds to the level at which the defect exists (calculated from the wavelength) is increased. The increase in the absorption coefficient is multiplied by a constant, whereby the defect density of the sample can be obtained.

Figure 13A:
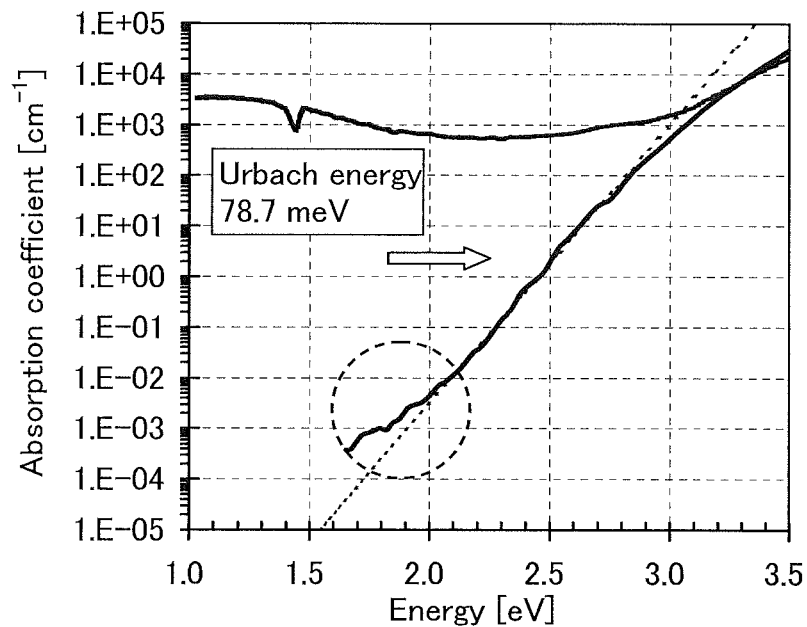
FIGS. 13A and 13B show CPM measurement results of a multi-layer film of one embodiment of the present invention.
Figure 13B:
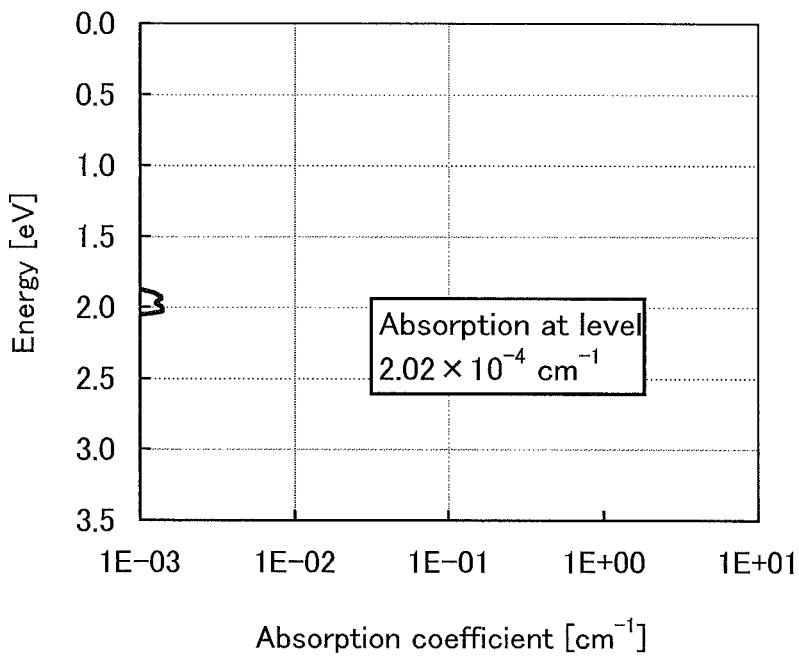

FIG. 13A shows results of fitting the absorption coefficient (broken line) measured using a spectrophotometer and the absorption coefficient (solid line) measured by CPM in the range of energy higher than or equal to the energy gap of each layer in the multi-layer film 106. Note that the Urbach energy obtained based on the absorption coefficient measured by CPM was 78.7 meV. The integral value of the absorption coefficient in the energy range was derived in such a manner that a background (dotted line) was subtracted from the absorption coefficient measured by CPM in the energy range shown with a dashed-line circle in FIG. 13A (see FIG. 13B). As a result, the absorption coefficient due to the localized level of this sample was found to be $2.02 \times 10^{-4}$ cm$^{-1}$.

The localized level obtained here is probably due to an impurity or a defect. From the above, there are extremely few levels due to an impurity or a defect in the multi-layer film 106. That is, the transistor including the multi-layer film 106 has stable electrical characteristics.

<1-7. Manufacturing Apparatus>

A film formation apparatus for forming the oxide semiconductor layer 106b with a high degree of crystallinity will be described below.

First, a structure of a film formation apparatus which allows the entry of few impurities into a film at the time of the film formation is described with reference to FIG. 14 and FIGS. 15A to 15C.

Figure 14:
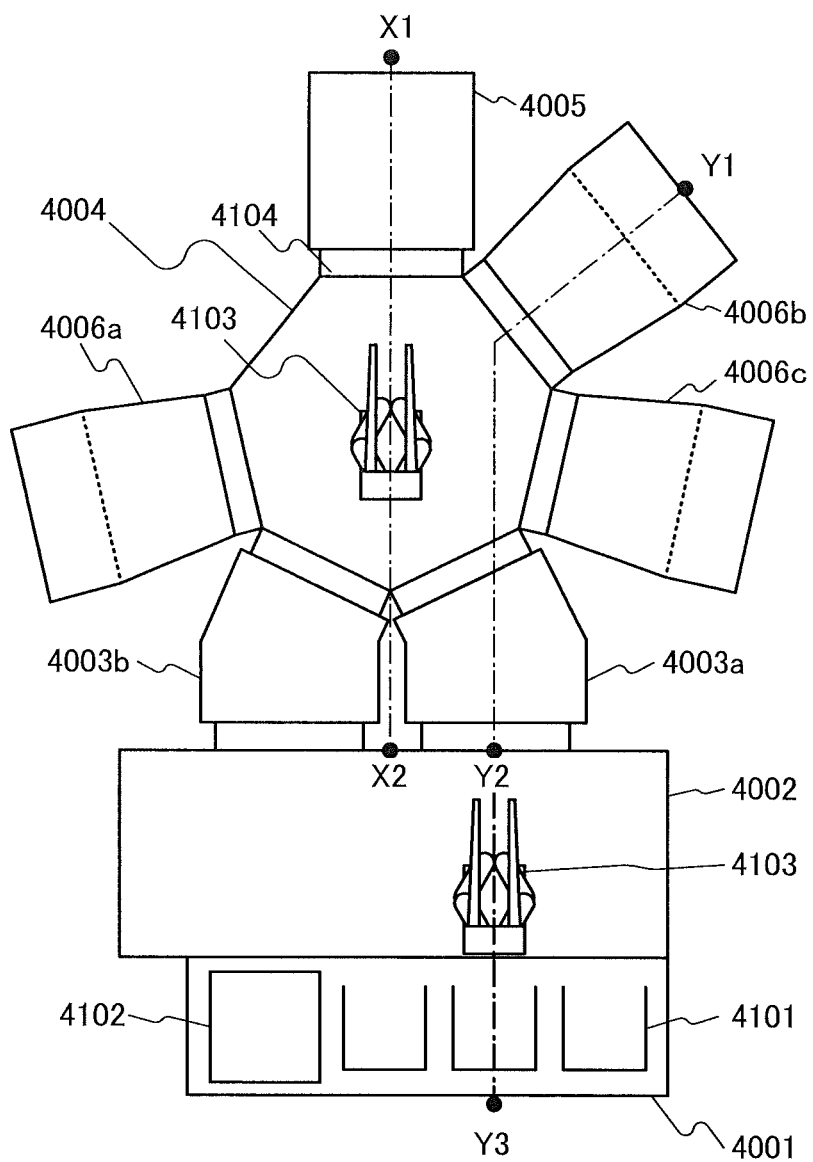
FIG. 14 is a top view illustrating an example of a film formation apparatus.

FIG. 14 is a top view schematically illustrating a single wafer multi-chamber film formation apparatus 4000. The film formation apparatus 4000 includes an atmosphere-side substrate supply chamber 4001 including a cassette port 4101 for holding a substrate and an alignment port 4102 for performing alignment of a substrate, an atmosphere-side substrate transfer chamber 4002 through which a substrate is transferred from the atmosphere-side substrate supply chamber 4001, a load lock chamber 4003a where a substrate is carried and the pressure inside the chamber is switched from atmospheric pressure to reduced pressure or from reduced pressure to atmospheric pressure, an unload lock chamber 4003b where a substrate is carried out and the pressure inside the chamber is switched from reduced pressure to atmospheric pressure or from atmospheric pressure to reduced pressure, a transfer chamber 4004 through which a substrate is transferred in a vacuum, a substrate heating chamber 4005 where a substrate is heated, and film formation chambers 4006a, 4006b, and 4006c in each of which a target is placed for film formation.

Note that a plurality of the cassette ports 4101 may be provided as illustrated in FIG. 14 (in FIG. 14, three cassette ports 4101 are provided).

The atmosphere-side substrate transfer chamber 4002 is connected to the load lock chamber 4003a and the unload lock chamber 4003b, the load lock chamber 4003a and the unload lock chamber 4003b are connected to the transfer chamber 4004, and the transfer chamber 4004 is connected to the substrate heating chamber 4005 and the film formation chambers 4006a, 4006b, and 4006c.

Gate valves 4104 are provided for connecting portions between chambers so that each chamber except the atmosphere-side substrate supply chamber 4001 and the atmosphere-side substrate transfer chamber 4002 can be independently kept under vacuum. Moreover, the atmosphere-side substrate transfer chamber 4002 and the transfer chamber 4004 each include a transfer robot 4103, with which a glass substrate can be transferred.

Further, it is preferable that the substrate heating chamber 4005 also serve as a plasma treatment chamber. In the film formation apparatus 4000, it is possible to transfer a substrate without exposure to the air between treatment and treatment; therefore, adsorption of impurities on a substrate can be suppressed. In addition, the order of film formation, heat treatment, or the like can be freely determined. Note that the number of the transfer chambers, the number of the film formation chambers, the number of the load lock chambers, the number of the unload lock chambers, and the number of the substrate heating chambers are not limited to the above, and the numbers thereof can be set as appropriate depending on the space for placement or the process conditions.

Figure 15A:
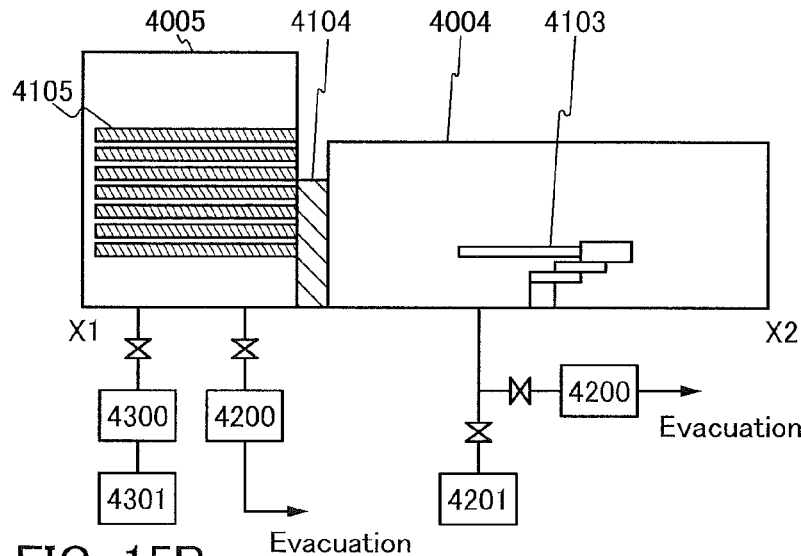
Figure 15B:
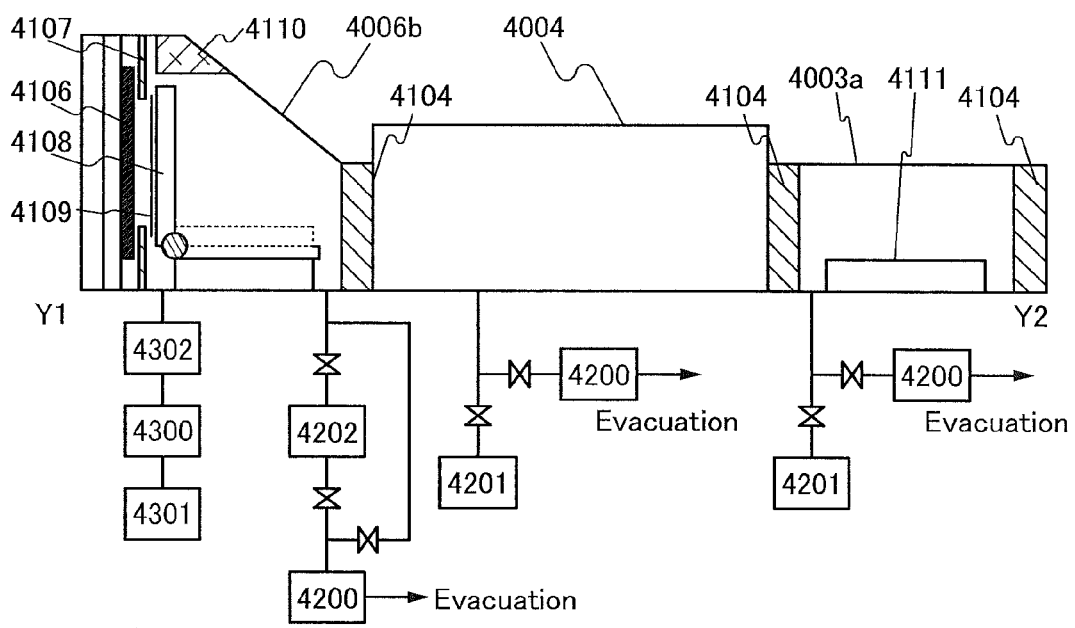
Figure 15C:
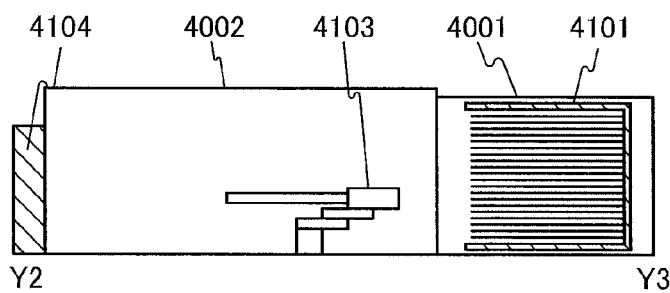

Next, FIG. 15A, FIG. 15B, and FIG. 15C are a cross-sectional view taken along dashed-dotted line X1-X2, a cross-sectional view taken along dashed-dotted line Y1-Y2, and a cross-sectional view taken along dashed-dotted line Y2-Y3, respectively, in the film formation apparatus 4000 illustrated in FIG. 14.

FIG. 15A is a cross section of the substrate heating chamber 4005 and the transfer chamber 4004, and the substrate heating chamber 4005 includes a plurality of heating stages 4105 which can hold a substrate. Note that although the number of heating stages 4105 illustrated in FIG. 15A is seven, it is not limited thereto and may be greater than or equal to one and less than seven, or greater than or equal to eight. It is preferable to increase the number of the heating stages 4105 because a plurality of substrates can be subjected to heat treatment at the same time, which leads to an increase in productivity. Further, the substrate heating chamber 4005 is connected to a vacuum pump 4200 through a valve. As the vacuum pump 4200, a dry pump and a mechanical booster pump can be used, for example.

As heating mechanism which can be used for the substrate heating chamber 4005, a resistance heater may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas.

Moreover, the substrate heating chamber 4005 is connected to a refiner 4301 through a mass flow controller 4300. Note that although the mass flow controller 4300 and the refiner 4301 can be provided for each of a plurality of kinds of gases, only one mass flow controller 4300 and one refiner 4301 are provided for easy understanding. As the gas introduced to the substrate heating chamber 4005, a gas whose dew point is −80° C. or lower, preferably −100° C. or lower can be used; for example, an oxygen gas, a nitrogen gas, and a rare gas (e.g., an argon gas) are used.

The transfer chamber 4004 includes the transfer robot 4103. The transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, evacuation can be performed using the vacuum pump 4200 when the pressure inside the transfer chamber 4004 is in the range of atmospheric pressure to a low vacuum (about 0.1 Pa to several hundred Pa) and then, by switching the valves, evacuation can be performed using the cryopump 4201 when the pressure inside the transfer chamber 4004 is in the range of middle vacuum to ultra-high vacuum (0.1 Pa to $1 \times 10^{-7}$ Pa).

Alternatively, two or more cryopumps 4201 may be connected in parallel to the transfer chamber 4004. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 15B is a cross section of the film formation chamber 4006b, the transfer chamber 4004, and the load lock chamber 4003a.

Here, the details of the film formation chamber (sputtering chamber) are described with reference to FIG. 15B. The film formation chamber 4006b illustrated in FIG. 15B includes a target 4106, an attachment protection plate 4107, and a substrate stage 4108. Note that here, a substrate 4109 is provided on the substrate stage 4108. Although not illustrated, the substrate stage 4108 may include a substrate holding mechanism which holds the substrate 4109, a rear heater which heats the substrate 4109 from the back surface, or the like.

Note that the substrate stage 4108 is held substantially vertically to a floor during film formation and is held substantially parallel to the floor when the substrate is delivered. In FIG. 15B, the position where the substrate stage 4108 is held when the substrate is delivered is denoted by a dashed line. With such a structure, the probability that dust or a particle which might be entered at the time of the film formation is attached to the substrate 4109 can be suppressed as compared with the case where the substrate stage 4108 is held parallel to the floor. However, there is a possibility that the substrate 4109 falls when the substrate stage 4108 is held vertically (90°) to the floor; therefore, the angle of the substrate stage 4108 to the floor is preferably wider than or equal to 80° and narrower than 90°.

The attachment protection plate 4107 can suppress deposition of a particle which is sputtered from the target 4106 on a region where deposition is not needed. Moreover, the attachment protection plate 4107 is preferably processed to prevent accumulated sputtered particles from being separated. For example, blasting treatment which increases surface roughness may be performed, or roughness may be formed on the surface of the attachment protection plate 4107.

The film formation chamber 4006b is connected to a mass flow controller 4300 through a gas heating system 4302, and the gas heating system 4302 is connected to a refiner 4301 through the mass flow controller 4300. With the gas heating system 4302, a gas which is introduced to the film formation chamber 4006b can be heated to a temperature higher than or equal to 40° C. and lower than or equal to 400° C., preferably higher than or equal to 50° C. and lower than or equal to 200° C. Note that although the gas heating system 4302, the mass flow controller 4300, and the refiner 4301 can be provided for each of a plurality of kinds of gases, only one gas heating system 4302, one mass flow controller 4300, and one refiner 4301 are provided for easy understanding. As the gas introduced to the film formation chamber 4006b, a gas whose dew point is −80° C. or lower, preferably −100° C. or lower can be used; for example, an oxygen gas, a nitrogen gas, and a rare gas (e.g., an argon gas) are used.

A facing-target-type sputtering apparatus may be provided in the film formation chamber 4006b. In each of the above-described structures of the facing-target-type sputtering apparatus, plasma is confined between the targets; therefore, plasma damage to a substrate can be reduced. Further, step coverage can be improved because an incident angle of a sputtered particle to the substrate can be made smaller depending on the inclination of the target.

Note that a parallel plate type sputtering apparatus or an ion beam sputtering apparatus may be provided in the film formation chamber 4006b.

In the case where the refiner is provided just before the gas is introduced, the length of a pipe between the refiner and the film formation chamber 4006b is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Further, a high-performance ultra-compact metal gasket joint (UPG joint) may be used as a joint of the pipe. A structure where all the materials of the pipe are metals is preferable because the effect of the generated released gas or the external leakage can be reduced as compared with a structure where resin or the like is used.

The film formation chamber 4006b is connected to a turbo molecular pump 4202 and a vacuum pump 4200 through valves.

In addition, the film formation chamber 4006b is provided with a cryotrap 4110.

The cryotrap 4110 is a mechanism which can adsorb a molecule (or an atom) having a relatively high melting point, such as water. The turbo molecular pump 4202 is capable of stably evacuating a large-sized molecule (or atom), needs low frequency of maintenance, and thus enables high productivity, whereas it has a low capability in evacuating hydrogen and water. Hence, the cryotrap 4110 is connected to the film formation chamber 4006b so as to have a high capability in evacuating water or the like. The temperature of a refrigerator of the cryotrap 4110 is set to be lower than or equal to 100 K, preferably lower than or equal to 80 K. In the case where the cryotrap 4110 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

Note that the evacuation method of the film formation chamber 4006b is not limited to the above, and a structure similar to that in the evacuation method described in the transfer chamber 4004 (the evacuation method using the cryopump and the vacuum pump) may be employed. Needless to say, the evacuation method of the transfer chamber 4004 may have a structure similar to that of the film formation chamber 4006b (the evacuation method using the turbo molecular pump and the vacuum pump).

Note that in each of the above transfer chamber 4004, the substrate heating chamber 4005, and the film formation chamber 4006b, the back pressure (total pressure) and the partial pressure of each gas molecule (atom) are preferably set as follows. In particular, the back pressure and the partial pressure of each gas molecule (atom) in the film formation chamber 4006b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, more preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, more preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, more preferably less than or equal to $3 \times 10^{-6}$ Pa. Further, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, more preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the above transfer chamber 4004, the substrate heating chamber 4005, and the film formation chamber 4006b preferably have a small amount of external leakage or internal leakage.

For example, in each of the above transfer chamber 4004, the substrate heating chamber 4005, and the film formation chamber 4006b, the leakage rate is less than or equal to $3 \times 10^{-6}$ Pa·m³/s, preferably less than or equal to $1 \times 10^{-6}$ Pa·m³/s. The leakage rate of a gas molecule (atom) having a mass-to-charge ratio (m/z) of 18 is less than or equal to $1 \times 10^{-7}$ Pa·m³/s, preferably less than or equal to $3 \times 10^{-8}$ Pa·m³/s. The leakage rate of a gas molecule (atom) having a mass-to-charge ratio (m/z) of 28 is less than or equal to $1 \times 10^{-5}$ Pa·m³/s, preferably less than or equal to $1 \times 10^{-6}$ Pa·m³/s. The leakage rate of a gas molecule (atom) having a mass-to-charge ratio (m/z) of 44 is less than or equal to $3 \times 10^{-6}$ Pa·m³/s, preferably less than or equal to $1 \times 10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the film formation chamber 4006b can be sealed with a metal gasket. For the metal gasket, metal covered with iron fluoride, aluminum oxide, or chromium oxide is preferably used. The metal gasket realizes higher adhesion than an O-ring, and can reduce the external leakage. Further, with the use of the metal covered with iron fluoride, aluminum oxide, chromium oxide, or the like, which is in the passive state, the release of gas containing impurities released from the metal gasket is suppressed, so that the internal leakage can be reduced.

For a member of the film formation apparatus 4000, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the film formation apparatus 4000 may be covered with iron fluoride, aluminum oxide, chromium oxide, or the like.

The member of the film formation apparatus 4000 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbate is present in the film formation chamber, the adsorbate does not affect the pressure in the film formation chamber because it is adsorbed onto an inner wall or the like; however, the adsorbate causes gas to be released when the inside of the film formation chamber is evacuated. Therefore, although there is no correlation between the leakage rate and the evacuation rate, it is important that the adsorbate present in the film formation chamber be desorbed as much as possible and evacuation be performed in advance with the use of a pump with high evacuation capability. Note that the film formation chamber may be subjected to baking to promote desorption of the adsorbate. By the baking, the desorption rate of the adsorbate can be increased about tenfold. The baking can be performed at a temperature in the range of 100° C. to 450° C. At this time, when the adsorbate is removed while an inert gas is introduced to the film formation chamber, the desorption rate of water or the like, which is difficult to be desorbed simply by evacuation, can be further increased. Note that when the inert gas which is introduced is heated to substantially the same temperature as the baking temperature of the film formation chamber, the desorption rate of the adsorbate can be further increased. Here, a rare gas is preferably used as an inert gas. Depending on the kind of a film to be formed, oxygen or the like may be used instead of an inert gas. For example, in the case of forming an oxide, the use of oxygen which is the main component of the oxide is preferable in some cases.

Alternatively, treatment for evacuating the inside of the film formation chamber is preferably performed a certain period of time after heated oxygen, a heated inert gas such as a heated rare gas, or the like is introduced to increase a pressure in the film formation chamber. The introduction of the heated gas can desorb the adsorbate in the film formation chamber, and the impurities present in the film formation chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the film formation chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the film formation chamber is evacuated in the time range of 5 minutes to 300 minutes, preferably 10 minutes to 120 minutes.

The desorption rate of the adsorbate can be further increased also by dummy film formation. Here, the dummy film formation refers to film formation on a dummy substrate by a sputtering method or the like, in which a film is deposited on the dummy substrate and the inner wall of the film formation chamber so that impurities in the film formation chamber and an adsorbate on the inner wall of the film formation chamber are confined in the film. For a dummy substrate, a substrate which releases a smaller amount of gas is preferably used. By performing dummy film formation, the concentration of impurities in a film which will be formed later can be reduced. Note that the dummy film formation may be performed at the same time as the baking of the film formation chamber.

Next, the details of the transfer chamber 4004 and the load lock chamber 4003a illustrated in FIG. 15B and the atmosphere-side substrate transfer chamber 4002 and the atmosphere-side substrate supply chamber 4001 illustrated in FIG. 15C are described. Note that FIG. 15C is a cross section of the atmosphere-side substrate transfer chamber 4002 and the atmosphere-side substrate supply chamber 4001.

For the transfer chamber 4004 illustrated in FIG. 15B, the description of the transfer chamber 4004 illustrated in FIG. 15A can be referred to.

The load lock chamber 4003a includes a substrate delivery stage 4111. When a pressure in the load lock chamber 4003a becomes atmospheric pressure by being increased from reduced pressure, the substrate delivery stage 4111 receives a substrate from the transfer robot 4103 provided in the atmosphere-side substrate transfer chamber 4002. After that, the load lock chamber 4003a is evacuated into vacuum so that the pressure therein becomes reduced pressure and then the transfer robot 4103 provided in the transfer chamber 4004 receives the substrate from the substrate delivery stage 4111.

Further, the load lock chamber 4003a is connected to a vacuum pump 4200 and a cryopump 4201 through valves. For a method for connecting evacuation systems such as the vacuum pump 4200 and the cryopump 4201, the description of the method for connecting the transfer chamber 4004 can be referred to, and the description thereof is omitted here. Note that the unload lock chamber 4003b illustrated in FIG. 14 can have a structure similar to that in the load lock chamber 4003a.

The atmosphere-side substrate transfer chamber 4002 includes the transfer robot 4103. The transfer robot 4103 can deliver a substrate from the cassette port 4101 to the load lock chamber 4003a or deliver a substrate from the load lock chamber 4003a to the cassette port 4101. Further, a mechanism for suppressing entry of dust or a particle, such as high efficiency particulate air (HEPA) filter, may be provided above the atmosphere-side substrate transfer chamber 4002 and the atmosphere-side substrate supply chamber 4001.

The atmosphere-side substrate supply chamber 4001 includes a plurality of the cassette ports 4101. The cassette port 4101 can hold a plurality of substrates.

When an oxide layer is formed with the use of the above film formation apparatus, the entry of impurities into the oxide layer can be suppressed. Further, when a film in contact with the oxide layer is formed with the use of the above film formation apparatus, the entry of impurities into the oxide layer from the film in contact therewith can be suppressed.

Next, a method for forming a CAAC-OS layer with the use of the above film formation apparatus is described.

The surface temperature of the sputtering target is set to be lower than or equal to 100° C., preferably lower than or equal to 50° C., more preferably about room temperature (typically, 25° C.). In a sputtering apparatus for a large substrate, a large sputtering target is often used. However, it is difficult to form a sputtering target for a large substrate without a juncture. In fact, a plurality of sputtering targets are arranged so that there is as little space as possible therebetween to obtain a large shape; however, a slight space is inevitably generated. When the surface temperature of the sputtering target increases, in some cases, Zn or the like is volatilized from such a slight space and the space might be expanded gradually. When the space expands, a metal of a backing plate or a metal used for adhesion might be sputtered and might cause an increase in impurity concentration. Thus, it is preferable that the sputtering target be cooled sufficiently.

Specifically, for the backing plate, a metal having high conductivity and a high heat dissipation property (specifically Cu) is used. The sputtering target can be cooled efficiently by making a sufficient amount of cooling water flow through a water channel which is formed in the backing plate.

The oxide layer is formed in an oxygen gas atmosphere with a substrate heating temperature higher than or equal to 100° C. and lower than or equal to 600° C., preferably higher than or equal to 150° C. and lower than or equal to 550° C., more preferably higher than or equal to 200° C. and lower than or equal to 500° C. The thickness of the oxide layer is greater than or equal to 1 nm and less than or equal to 40 nm, preferably greater than or equal to 3 nm and less than or equal to 20 nm. As the substrate heating temperature at the time of the film formation is higher, the concentration of impurities in the obtained oxide layer is lower. Further, migration of sputtered particles on a deposition surface is likely to occur; therefore, the atomic arrangement in the oxide layer is ordered and the density thereof is increased, so that a CAAC-OS layer with a high degree of crystallinity is formed easily. Furthermore, when the film formation is performed in an oxygen gas atmosphere, plasma damage is alleviated and a surplus atom such as a rare gas atom is not contained in the oxide layer, whereby a CAAC-OS layer with a high degree of crystallinity is formed easily. Note that the film formation may be performed in a mixed atmosphere including an oxygen gas and a rare gas. In that case, the percentage of an oxygen gas is set to be greater than or equal to 30 vol. %, preferably greater than or equal to 50 vol. %, more preferably greater than or equal to 80 vol. %.

Note that in the case where the sputtering target includes Zn, plasma damage is alleviated by the film formation in an oxygen gas atmosphere; thus, an oxide layer in which Zn is unlikely to be volatilized can be obtained.

The oxide layer is formed under conditions in which the film formation pressure is set to be less than or equal to 0.8 Pa, preferably less than or equal to 0.4 Pa, and the distance between the sputtering target and a substrate is set to be less than or equal to 100 mm, preferably less than or equal to 40 mm, more preferably less than or equal to 25 mm. When the oxide layer is formed under such a condition, the frequency of the collision between a sputtered particle and another sputtered particle, a gas molecule, or an ion can be reduced. That is, depending on the film formation pressure, the distance between the sputtering target and the substrate is made shorter than the mean free path of a sputtered particle, a gas molecule, or an ion, so that the concentration of impurities entering the film can be reduced.

For example, when the pressure is set at 0.4 Pa and the temperature is set at 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, a methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm. Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the degree of crystallinity is lowered due to the large diameter of the molecule (atom) when the molecule (atom) enters the film. For this reason, it can be said that, for example, a molecule (atom) whose diameter is larger than that of Ar is likely to behave as an impurity.

Next, heat treatment is performed. The heat treatment is performed under reduced pressure or in an inert atmosphere or an oxidation atmosphere. By the heat treatment, the concentration of impurities in the CAAC-OS layer can be reduced.

The heat treatment is preferably performed in a manner such that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the concentration of impurities in the CAAC-OS layer can be reduced; however, oxygen vacancies are caused at the same time. By the heat treatment in an oxidation atmosphere, the caused oxygen vacancies can be reduced.

When heat treatment is performed on the CAAC-OS layer in addition to the substrate heating at the time of the film formation, the concentration of impurities in the film can be reduced.

Specifically, the concentration of hydrogen in the CAAC-OS layer, which is measured by secondary ion mass spectrometry (SIMS), can be set to be lower than or equal to $2 \times 10^{20}$ atoms/$cm^3$, preferably lower than or equal to $5 \times 10^{19}$ atoms/$cm^3$, more preferably lower than or equal to $1 \times 10^{19}$ atoms/$cm^3$, further preferably lower than or equal to $5 \times 10^{18}$ atoms/$cm^3$.

The concentration of nitrogen in the CAAC-OS layer, which is measured by SIMS, can be set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, further preferably lower than or equal to $5 \times 10^{17}$ atoms/$cm^3$.

The concentration of carbon in the CAAC-OS layer, which is measured by SIMS, can be set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, further preferably lower than or equal to $5 \times 10^{17}$ atoms/$cm^3$.

The amount of each of the following gas molecules (atoms) released from the CAAC-OS layer can be less than or equal to $1 \times 10^{19}$/$cm^3$, preferably less than or equal to $1 \times 10^{18}$/$cm^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A measurement method of the amount of released oxygen atoms, which will be described later, is referred to for a measurement method of the release amount using TDS analysis.

In the above manner, a CAAC-OS layer with a high degree of crystallinity can be formed.

<2. Transistor>

A transistor including the multi-layer film 106 is described below.

<2-1. Transistor Structure (1)>

In this section, a bottom-gate transistor is described.

<2-1-1. Transistor Structure (1-1)>

Here, a bottom-gate top-contact (BGTC) structure transistor, which is one kind of bottom-gate transistor, is described with reference to FIGS. 16A to 16D.

Figure 16A:
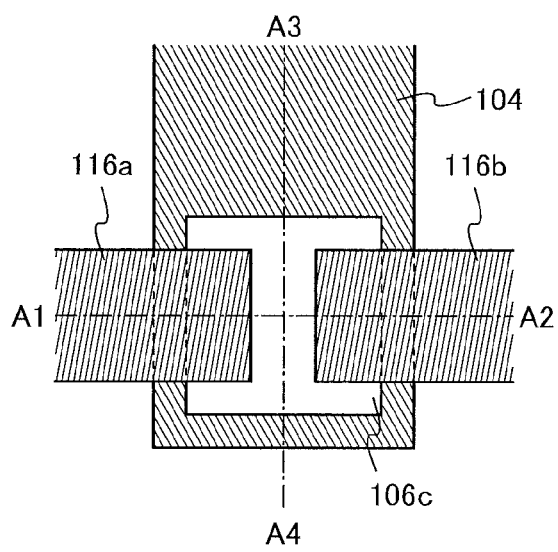
FIGS. 16A to 16D are a top view and cross-sectional views illustrating a semiconductor device of one embodiment of the present invention.
Figure 16C:
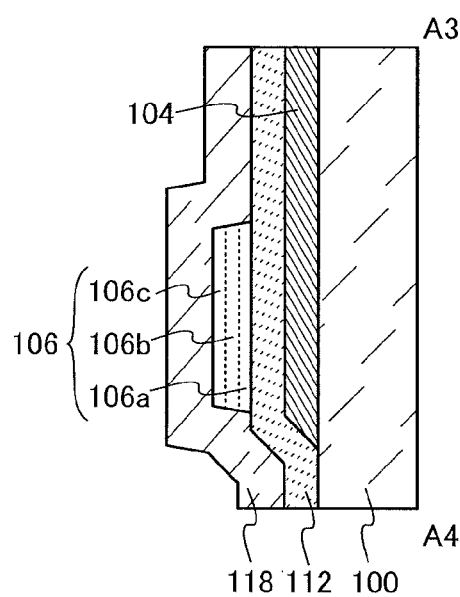
Figure 16B:
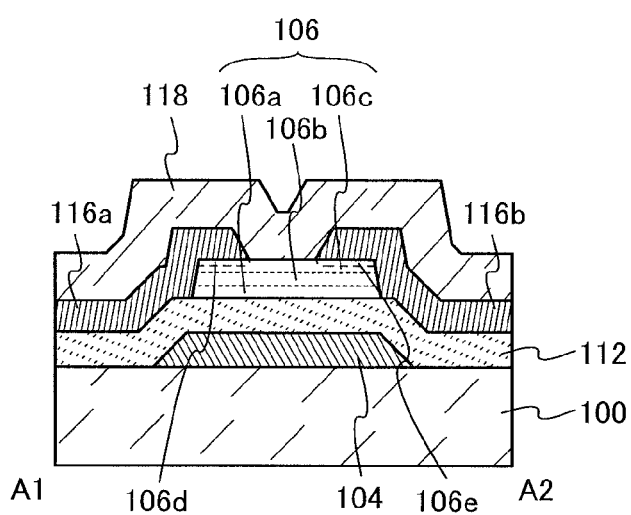

FIGS. 16A to 16D are a top view and cross-sectional views of the BGTC transistor. FIG. 16A is the top view of the transistor. FIG. 16B is the cross-sectional view taken along dashed-dotted line A1-A2 in FIG. 16A. FIG. 16C is the cross-sectional view taken along dashed-dotted line A3-A4 in FIG. 16A.

The transistor illustrated in FIG. 16B includes a gate electrode 104 over a substrate 100; a gate insulating film 112 over the gate electrode 104; the multi-layer film 106 including the oxide layer 106*a* over the gate insulating film 112, the oxide semiconductor layer 106*b* over the oxide layer 106*a*, and the oxide layer 106*c* over the oxide semiconductor layer 106*b*; a source electrode 116*a* and a drain electrode 116*b* over the gate insulating film 112 and the multi-layer film 106; and a protective insulating film 118 over the multi-layer film 106, the source electrode 116*a*, and the drain electrode 116*b*.

The source electrode 116*a* and the drain electrode 116*b* are in contact with side edges of the oxide semiconductor layer 106*b*.

Further, as illustrated in FIG. 16B, oxygen is taken away from part of the oxide layer 106*c* depending on the kind of conductive film used for the source electrode 116*a* and the drain electrode 116*b* so that a source region 106*d* and a drain region 106*e* are formed in the oxide layer 106*c*.

In FIG. 16A, the distance between the source electrode 116*a* and the drain electrode 116*b* in a region of the multi-layer film 106 overlapping with the gate electrode 104 is referred to as a channel length. Note that in the case where the transistor includes the source region 106*d* and the drain region 106*e*, the distance between the source region 106*d* and the drain region 106*e* in the region overlapping with the gate electrode 104 may be referred to as a channel length.

Note that a channel formation region refers to a region which overlaps with the gate electrode 104 and is located between the source electrode 116*a* and the drain electrode 116*b* when seen from above in the multi-layer film 106 (see FIG. 16B). Further, a channel region refers to a region through which current mainly flows in the channel formation region. Here, the channel region refers to a portion of the oxide semiconductor layer 106*b* in the channel formation region.

The multi-layer film 106, and the oxide layer 106*a*, the oxide semiconductor layer 106*b*, and the oxide layer 106*c* in the multi-layer film 106 will be described below. Note that the description in another section can be referred to for the multi-layer film 106.

The oxide layer 106*a* includes one or more elements other than oxygen included in the oxide semiconductor layer 106*b*. In addition, the energy at the bottom of the conduction band of the oxide layer 106*a* is closer to a vacuum level than that of the oxide semiconductor layer 106*b* by 0.05 eV or more, 0.07 eV or more, 0.1 eV or more, or 0.15 eV or more and 2 eV or less, 1 eV or less, 0.5 eV or less, or 0.4 eV or less. Note that the oxide semiconductor layer 106*b* preferably contains at least indium because carrier mobility can be increased. When an electric field is applied to the gate electrode 104 at this time, a channel is formed in the oxide semiconductor layer 106*b* of the multi-layer film 106, whose energy at the bottom of the conduction band is low. That is, the oxide layer 106*a* is formed between the oxide semiconductor layer 106*b* and the gate insulating film 112, whereby a channel of the transistor can be formed in the oxide semiconductor layer 106*b* which is not in contact with the gate insulating film 112. Further, since the oxide layer 106*a* includes one or more elements other than oxygen included in the oxide semiconductor layer 106*b*, interface scattering is unlikely to occur at the interface between the oxide semiconductor layer 106*b* and the oxide layer 106*a*. Thus, the transistor can have a high field-effect mobility because the movement of carriers is not hindered at the interface.

The oxide layer 106*a* may contain, for example, aluminum, silicon, titanium, gallium, germanium, yttrium, zirconium, tin, lanthanum, cerium, or hafnium at a higher atomic ratio than the oxide semiconductor layer 106*b*. Specifically, the amount of any of the above elements in the oxide layer 106*a* in an atomic ratio is 1.5 times or more, preferably 2 times or more, more preferably 3 times or more as much as that in the oxide semiconductor layer 106*b* in an atomic ratio. Any of the above elements is strongly bonded to oxygen and thus has a function of suppressing generation of an oxygen vacancy in the oxide layer 106*a*. That is, an oxygen vacancy is more unlikely to be generated in the oxide layer 106*a* than in the oxide semiconductor layer 106*b*.

Alternatively, when each of the oxide layer 106*a* and the oxide semiconductor layer 106*b* is an In-M-Zn oxide and the oxide layer 106*a* and the oxide semiconductor layer 106*b* contain In, M, and Zn in an atomic ratio of $x_1:y_1:z_1$ and an atomic ratio of $x_2:y_2:z_2$, respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 106*a* and the oxide semiconductor layer 106*b* in which $y_1/x_1$ is 1.5 times or more as large as $y_2/x_2$ are selected. More preferably, the oxide layer 106*a* and the oxide semiconductor layer 106*b* in which $y_1/x_1$ is 2 times or more as large as $y_2/x_2$ are selected. Further preferably, the oxide layer 106*a* and the oxide semiconductor layer 106*b* in which $y_1/x_1$ is 3 times or more as large as $y_2/x_2$ are selected. In the oxide semiconductor layer 106*b* at this time, $y_1$ is preferably larger than or equal to $x_1$ because the transistor can have stable electrical characteristics. However, when $y_1$ is 3 times or more as large as $x_1$, the field-effect mobility of the transistor is reduced; accordingly, $y_1$ is preferably equal to $x_1$ or smaller than 3 times $x_1$.

The thickness of the oxide layer 106*a* is greater than or equal to 3 nm and less than or equal to 100 nm, preferably greater than or equal to 3 nm and less than or equal to 50 nm. The thickness of the oxide semiconductor layer 106*b* is greater than or equal to 3 nm and less than or equal to 200 nm, preferably greater than or equal to 3 nm and less than or equal to 100 nm, more preferably greater than or equal to 3 nm and less than or equal to 50 nm.

The oxide layer 106c includes one or more elements other than oxygen included in the oxide semiconductor layer 106b. In addition, the energy at the bottom of the conduction band of the oxide layer 106c is closer to a vacuum level than that of the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less. Further, since the oxide layer 106c includes one or more elements other than oxygen included in the oxide semiconductor layer 106b, an interface level is unlikely to be formed at the interface between the oxide semiconductor layer 106b and the oxide layer 106c. When the interface has an interface level, in some cases, a second transistor in which the interface serves as a channel and which has a different threshold voltage is formed; accordingly, the apparent threshold voltage of the transistor is changed. Thus, with the oxide layer 106c, fluctuation in electrical characteristics of the transistors, such as a threshold voltage, can be reduced.

The oxide layer 106c may contain, for example, aluminum, silicon, titanium, gallium, germanium, yttrium, zirconium, tin, lanthanum, cerium, or hafnium at a higher atomic ratio than the oxide semiconductor layer 106b. Specifically, the amount of any of the above elements in the oxide layer 106c in an atomic ratio is 1.5 times or more, preferably 2 times or more, more preferably 3 times or more as much as that in the oxide semiconductor layer 106b in an atomic ratio. Any of the above elements is strongly bonded to oxygen and thus has a function of suppressing generation of an oxygen vacancy in the oxide layer 106c. That is, an oxygen vacancy is more unlikely to be generated in the oxide layer 106c than in the oxide semiconductor layer 106b.

Alternatively, when each of the oxide semiconductor layer 106b and the oxide layer 106c is an In-M-Zn oxide and the oxide semiconductor layer 106b and the oxide layer 106c contain In, M, and Zn in an atomic ratio of $x_2:y_2:z_2$ and an atomic ratio of $x_3:y_3:z_3$, respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layer 106b and the oxide layer 106c in which $y_3/x_3$ is 1.5 times or more as large as $y_2/x_2$ are selected. More preferably, the oxide semiconductor layer 106b and the oxide layer 106c in which $y_3/x_3$ is 2 times or more as large as $y_2/x_2$ are selected. Further preferably, the oxide semiconductor layer 106b and the oxide layer 106c in which $y_3/x_3$ is 3 times or more as large as $y_2/x_2$ are selected. In the oxide semiconductor layer 106b at this time, $y_2$ is preferably larger than or equal to $x_2$ because the transistor can have stable electrical characteristics. However, when $y_2$ is 3 times or more as large as $x_2$, the field-effect mobility of the transistor is reduced; accordingly, $y_2$ is preferably equal to $x_2$ or smaller than 3 times $x_2$.

The thickness of the oxide layer 106c is greater than or equal to 3 nm and less than or equal to 100 nm, preferably greater than or equal to 3 nm and less than or equal to 50 nm.

Note that the oxide layer 106a, the oxide semiconductor layer 106b, and the oxide layer 106c each have a crystalline structure or a structure in which no clear crystal part can be seen in a TEM image. Preferably, the oxide layer 106a has a structure in which no clear crystal part can be seen in a TEM image, the oxide semiconductor layer 106b has a crystalline structure, and the oxide layer 106c has a crystalline structure or a structure in which no clear crystal part can be seen in a TEM image. Since the oxide semiconductor layer 106b where a channel is formed has a crystalline structure, a transistor can have stable electrical characteristics.

Other structures of the transistor are described below.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is sometimes difficult due to shrinkage of the substrate 100, which is caused by heat treatment or the like in the manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment for one hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. As the method for providing a transistor over a flexible substrate, there is also a method in which a transistor is formed over a non-flexible substrate, and then, the transistor is separated from the non-flexible substrate and transferred to the substrate 100 which is a flexible substrate. In that case, a separation layer is preferably provided between the non-flexible substrate and the transistor.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

Note that the gate electrode 104 is provided such that the edge of the multi-layer film 106 is located on the inner side than the edge of the gate electrode 104 as illustrated in FIG. 16A. By providing the gate electrode 104 at such a position, when light irradiation is performed from the substrate 100 side, generation of carriers in the multi-layer film 106 due to light can be suppressed. Note that the edge of the multi-layer film 106 may be located on the outer side than the edge of the gate electrode 104.

The gate insulating film 112 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3 \times 10^{17}$ spins/cm$^3$, preferably less than or equal to $5 \times 10^{16}$ spins/cm$^3$ is used. As the silicon oxide layer, a silicon oxide layer having excess oxygen is preferably used. As the silicon nitride layer, a silicon nitride layer from which hydrogen and ammonia are less likely to be released is used. The amount of discharge of hydrogen or ammonia may be measured by thermal desorption spectroscopy (TDS).

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. Note that the source electrode 116a and the drain electrode 116b may have the same composition or different compositions.

The protective insulating film 118 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multi-layer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Figure 16D:
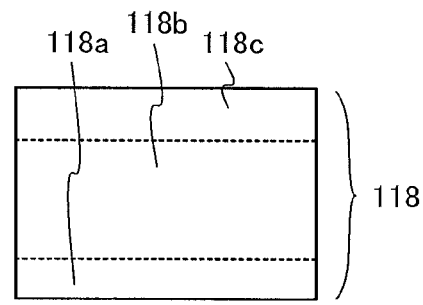

Alternatively, the protective insulating film 118 may be, for example, a multi-layer film including a first silicon oxide layer 118a as a first layer, a second silicon oxide layer 118b as a second layer, and a silicon nitride layer 118c as a third layer (see FIG. 16D). In that case, the first silicon oxide layer 118a and/or the second silicon oxide layer 118b may be a silicon oxynitride layer. In addition, the silicon nitride layer may be a silicon nitride oxide layer. As the first silicon oxide layer 118a, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the second silicon oxide layer 118b, a silicon oxide layer having excess oxygen is used. As the silicon nitride layer 118c, a silicon nitride layer from which hydrogen and ammonia are less likely to be released is used. Further, as the silicon nitride layer, a silicon nitride layer which does not transmit or hardly transmits oxygen is used.

The silicon oxide layer having excess oxygen means a silicon oxide layer from which oxygen can be released by heat treatment or the like. An insulating film having excess oxygen means an insulating film from which oxygen is released by heat treatment.

Here, a film from which oxygen is released by heat treatment may release oxygen, the amount of which is greater than or equal to $1 \times 10^{18}$ atoms/cm$^3$, greater than or equal to $1 \times 10^{19}$ atoms/cm$^3$, or greater than or equal to $1 \times 10^{20}$ atoms/cm$^3$ in TDS analysis (converted into the number of oxygen atoms).

Here, a method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[FORMULA 1]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and a is a coefficient affecting the ion intensity in the TDS analysis. Refer to Japanese Published Patent Application No. H6-275697 for details of Formula 1. The amount of released oxygen was measured with a thermal desorption spectroscopy apparatus produced by ESCO Ltd., EMD-WA1000S/W using a silicon wafer containing hydrogen atoms at a concentration of $1 \times 10^{16}$ atoms/cm$^2$ as the reference sample.

Further, in the TDS analysis, part of oxygen is detected as an oxygen atom. The ratio between oxygen molecules and oxygen atoms can be calculated from the ionization rate of the oxygen molecules. Since the above a includes the ionization rate of the oxygen molecules, the number of the released oxygen atoms can also be estimated through the evaluation of the number of the released oxygen molecules.

Here, $N_{O2}$ is the number of the released oxygen molecules. The amount of released oxygen converted into oxygen atoms is twice the number of the released oxygen molecules.

Further, the film from which oxygen is released by heat treatment may contain a peroxide radical. Specifically, the spin density attributed to the peroxide radical is greater than or equal to $5 \times 10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

In the case where at least one of the gate insulating film 112 and the protective insulating film 118 is the insulating film containing excess oxygen, oxygen vacancies in the oxide semiconductor layer 106b can be reduced.

In the above-described transistor, the channel is formed in the oxide semiconductor layer 106b of the multi-layer film 106; thus, the transistor has stable electrical characteristics and a high field-effect mobility.

<2-1-2. Fabrication Method of Transistor Structure (1-1)>

Next, a method for manufacturing the transistor is described with reference to FIGS. 17A to 17C and FIGS. 18A and 18B.

First, the substrate 100 is prepared.

Next, a conductive film to be the gate electrode 104 is formed. The conductive film to be the gate electrode 104 may be formed using any of the conductive films given as examples of the gate electrode 104 by a sputtering method, a chemical vapor deposition (CVD) method, a molecular beam epitaxy (MBE) method, an atomic layer deposition (ALD) method, or a pulsed laser deposition (PLD) method.

Figure 17A:
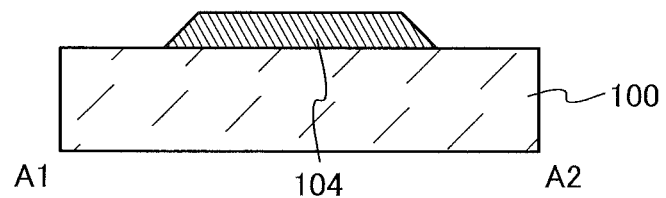
FIGS. 17A to 17C are cross-sectional views illustrating a fabrication method of a semiconductor device of one embodiment of the present invention.

Next, the conductive film to be the gate electrode 104 is partly etched to form the gate electrode 104 (see FIG. 17A).

Figure 17B:
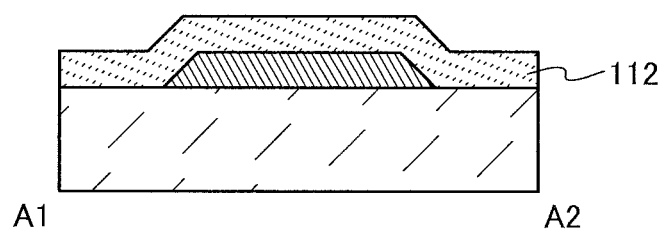

Next, the gate insulating film 112 is formed (see FIG. 17B). The gate insulating film 112 may be formed using any of the above insulating films given as examples of the gate insulating film 112 by a sputtering method, a CVD method, an MBE method, an ALD method, or a PLD method.

Next, an oxide layer to be the oxide layer 106a is formed. The oxide layer to be the oxide layer 106a may be formed using any of the above oxide layers given as examples of the oxide layer 106a by a sputtering method, a CVD method, an MBE method, an ALD method, or a PLD method.

Next, an oxide semiconductor layer to be the oxide semiconductor layer 106b is formed. For the method for forming the oxide semiconductor layer 106b, the description in the above section is referred to.

Next, an oxide layer to be the oxide layer 106c is formed. The oxide layer to be the oxide layer 106c may be formed using any of the above oxide layers given as examples of the oxide layer 106c by a sputtering method, a CVD method, an MBE method, an ALD method, or a PLD method.

It is preferable that the oxide layer to be the oxide layer 106a, the oxide semiconductor layer to be the oxide semiconductor layer 106b, and the oxide layer to be the oxide layer 106c be successively formed without being exposed to the air in order that impurities are less likely to be taken into each interface.

Figure 17C:
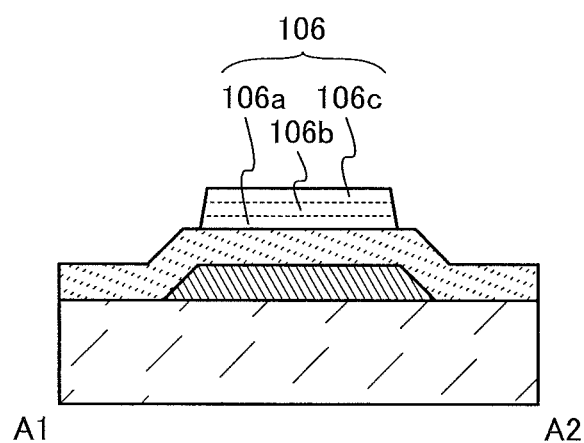

Next, the oxide layer to be the oxide layer 106a, the oxide semiconductor layer to be the oxide semiconductor layer 106b, and the oxide layer to be the oxide layer 106c are partly etched to form the multi-layer film 106 including the oxide layer 106a, the oxide semiconductor layer 106b, and the oxide layer 106c (see FIG. 17C).

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 106b can be improved, and in addition, impurities such as hydrogen and water can be removed from the gate insulating film 112 and/or the multi-layer film 106.

Then, a conductive film to be the source electrode 116a and the drain electrode 116b is formed. The conductive film to be the source electrode 116a and the drain electrode 116b may be formed using any of the above conductive films given as examples of the source electrode 116a and the drain electrode 116b by a sputtering method, a CVD method, an MBE method, an ALD method, or a PLD method.

Figure 18A:
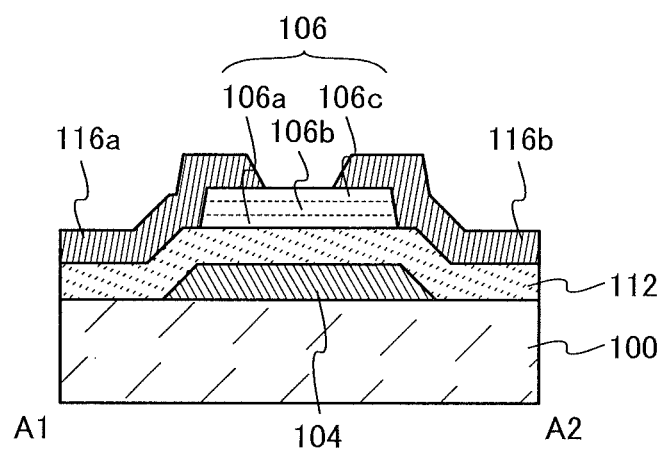
FIGS. 18A and 18B are cross-sectional views illustrating a fabrication method of a semiconductor device of one embodiment of the present invention.

Next, the conductive film to be the source electrode 116a and the drain electrode 116b is partly etched to form the source electrode 116a and the drain electrode 116b (see FIG. 18A).

Next, second heat treatment is preferably performed. The description of the first heat treatment can be referred to for the second heat treatment. By the second heat treatment, impurities such as hydrogen and water can be removed from the multi-layer film 106. Note that water is a compound containing hydrogen, and thus might behave as an impurity in the oxide semiconductor layer 106b.

Figure 18B:
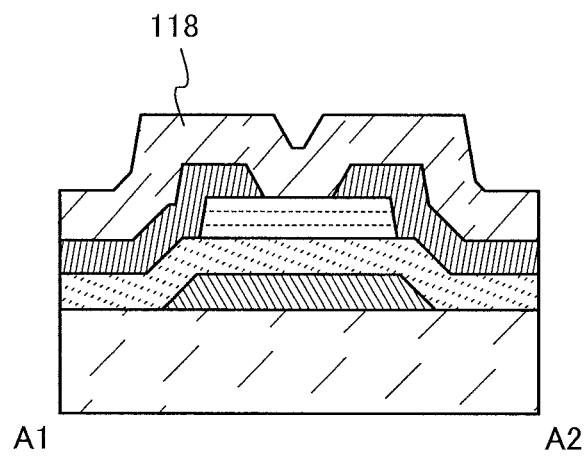

Next, the protective insulating film 118 is formed (see FIG. 18B). The protective insulating film 118 may be formed using any of the above insulating films given as examples of the protective insulating film 118 by a sputtering method, a CVD method, an MBE method, an ALD method, or a PLD method.

Here, the case where the protective insulating film 118 has a three-layer structure as illustrated in FIG. 16D is described. First, the first silicon oxide layer 118a is formed. Next, the second silicon oxide layer 118b is formed. Then, treatment for adding oxygen ions to the second silicon oxide layer 118b is preferably performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Then, the silicon nitride layer 118c is formed. In this manner, the protective insulating film 118 may be formed.

Next, third heat treatment is preferably performed. The description of the first heat treatment can be referred to for the third heat treatment. By the third heat treatment, excess oxygen is released from the gate insulating film 112 and/or the protective insulating film 118; thus, oxygen vacancies in the multi-layer film 106 can be reduced. Note that in the multi-layer film 106, an oxygen vacancy captures an adjacent oxygen atom, so that the oxygen vacancy seems to move. Therefore, excess oxygen can reach the oxide semiconductor layer 106b through the oxide layer 106a or the oxide layer 106c.

In the above manner, the BGTC transistor can be fabricated.

This transistor has stable electrical characteristics because oxygen vacancies in the oxide semiconductor layer 106b of the multi-layer film 106 are reduced.

<2-2. Transistor Structure (2)>

In this section, a top-gate transistor is described.

<2-2-1. Transistor Structure (2-1)>

Here, a top-gate top-contact (TGTC) structure transistor, which is one kind of top-gate transistor, is described with reference to FIGS. 19A to 19C.

Figure 19A:
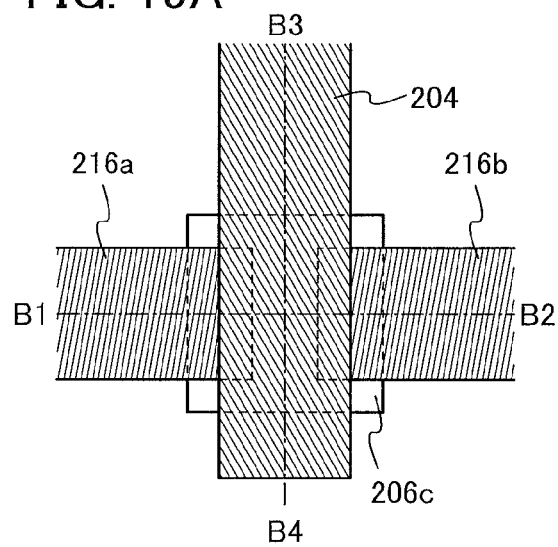
FIGS. 19A to 19C are a top view and cross-sectional views illustrating a semiconductor device of one embodiment of the present invention.
Figure 19C:
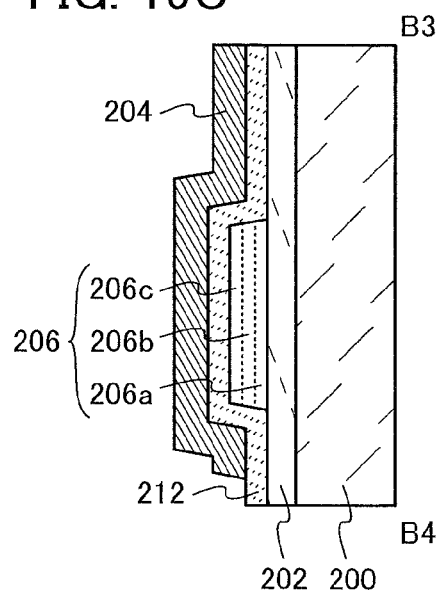
Figure 19B:
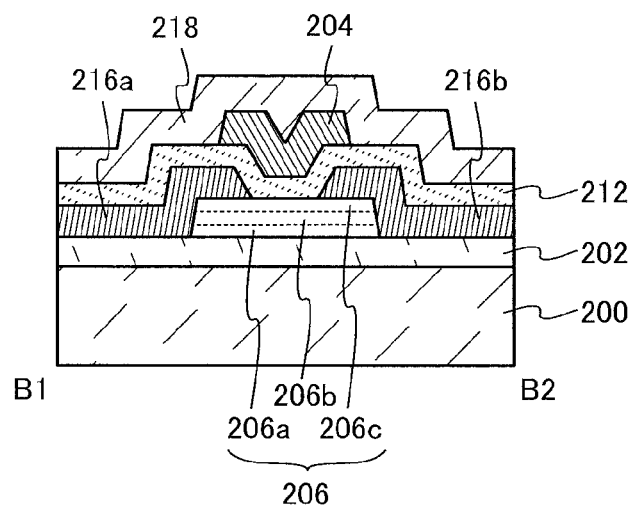

FIGS. 19A to 19C are a top view and cross-sectional views of the TGTC transistor. FIG. 19A is the top view of the transistor. FIG. 19B is the cross-sectional view taken along dashed-dotted line B1-B2 in FIG. 19A. FIG. 19C is the cross-sectional view taken along dashed-dotted line B3-B4 in FIG. 19A.

The transistor illustrated in FIG. 19B includes a base insulating film 202 over a substrate 200; a multi-layer film 206 including an oxide layer 206a over the base insulating film 202, an oxide semiconductor layer 206b over the oxide layer 206a, and an oxide layer 206c over the oxide semiconductor layer 206b; a source electrode 216a and a drain electrode 216b over the base insulating film 202 and the multi-layer film 206; a gate insulating film 212 over the multi-layer film 206, the source electrode 216a, and the drain electrode 216b; a gate electrode 204 over the gate insulating film 212; and a protective insulating film 218 over the gate insulating film 212 and the gate electrode 204. Note that the transistor does not necessarily include the base insulating film 202 and/or the protective insulating film 218.

The source electrode 216a and the drain electrode 216b are in contact with side edges of the oxide semiconductor layer 206b.

Further, oxygen is taken away from part of the oxide layer 206c depending on the kind of conductive film used for the source electrode 216a and the drain electrode 216b so that a source region and a drain region are formed in the oxide layer 206c.

In FIG. 19A, the distance between the source electrode 216a and the drain electrode 216b in a region of the multi-layer film 206 overlapping with the gate electrode 204 is referred to as a channel length. Note that in the case where the transistor includes the source region and the drain region, the distance between the source region and the drain region in the region overlapping with the gate electrode 204 may be referred to as a channel length.

Note that a channel formation region refers to a region which overlaps with the gate electrode 204 and is located between the source electrode 216a and the drain electrode 216b when seen from above in the multi-layer film 206. Further, a channel region refers to a region through which current mainly flows in the channel formation region. Here, the channel region refers to a portion of the oxide semiconductor layer 206b in the channel formation region.

For the multi-layer film 206, the description of the multi-layer film 106 is referred to. Specifically, for the oxide layer 206a, the description of the oxide layer 106c is referred to; for the oxide semiconductor layer 206b, the description of the oxide semiconductor layer 106b is referred to; and for the oxide layer 206c, the description of the oxide layer 106a is referred to.

For the substrate 200, the description of the substrate 100 is referred to. For the source electrode 216a and the drain electrode 216b, the description of the source electrode 116a and the drain electrode 116b is referred to. For the gate insulating film 212, the description of the gate insulating film 112 is referred to. For the gate electrode 204, the description of the gate electrode 104 is referred to. For the protective insulating film 218, the description of the protective insulating film 118 is referred to.

Although the edge of the multi-layer film 206 is located on the outer side than the edge of the gate electrode 204 in FIG. 19A, the edge of the multi-layer film 206 may be located on the inner side than the edge of the gate electrode 204 in order to suppress generation of carriers in the multi-layer film 206 due to light.

The base insulating film 202 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 202 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

The base insulating film 202 may be, for example, a multi-layer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits oxygen is used.

In the case where at least one of the gate insulating film 212 and the base insulating film 202 is the insulating film containing excess oxygen, oxygen vacancies in the oxide semiconductor layer 206b can be reduced.

In the above-described transistor, the channel is formed in the oxide semiconductor layer 206b of the multi-layer film 206; thus, the transistor has stable electrical characteristics and a high field-effect mobility.

<2-2-2. Fabrication Method of Transistor Structure (2-1)>

Next, a method for manufacturing the transistor is described with reference to FIGS. 20A to 20C and FIGS. 21A and 21B.

First, the substrate 200 is prepared.

Next, an oxide layer to be the oxide layer 206a is formed. For the method for forming the oxide layer to be the oxide layer 206a, the description of the method for forming the oxide layer to be the oxide layer 106c is referred to.

Next, an oxide semiconductor layer to be the oxide semiconductor layer 206b is formed. For the method for forming the oxide semiconductor layer to be the oxide semiconductor layer 206b, the description of the method for forming the oxide semiconductor layer to be the oxide semiconductor layer 106b is referred to.

Then, an oxide layer to be the oxide layer 206c is formed. For the method for forming the oxide layer to be the oxide layer 206c, the description of the method for forming the oxide layer to be the oxide layer 106a is referred to.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the oxide semiconductor layer to be the oxide semiconductor layer 206b can be improved, and in addition, impurities such as hydrogen and water can be removed from the base insulating film 202, the oxide layer to be the oxide layer 206a, the oxide semiconductor layer to be the oxide semiconductor layer 206b, and/or the oxide layer to be the oxide layer 206c.

Figure 20A:
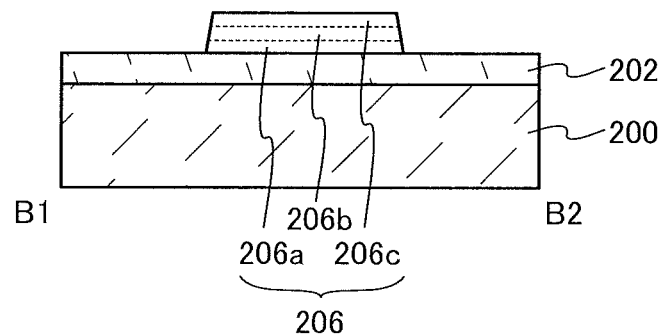
FIGS. 20A to 20C are cross-sectional views illustrating a fabrication method of a semiconductor device of one embodiment of the present invention.

Next, the oxide layer to be the oxide layer 206a, the oxide semiconductor layer to be the oxide semiconductor layer 206b, and the oxide layer to be the oxide layer 206c are partly etched to form the multi-layer film 206 including the oxide layer 206a, the oxide semiconductor layer 206b, and the oxide layer 206c (see FIG. 20A).

Then, a conductive film to be the source electrode 216a and the drain electrode 216b is formed. For the method for forming the conductive film to be the source electrode 216a and the drain electrode 216b, the description of the method for forming the conductive film to be the source electrode 116a and the drain electrode 116b is referred to.

Figure 20B:
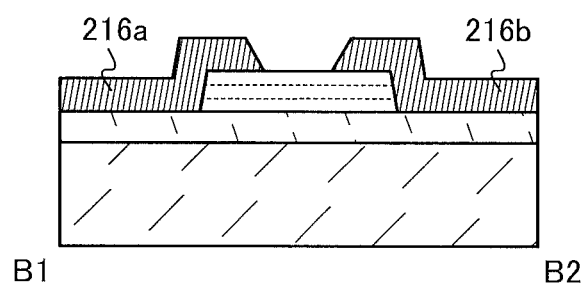

Next, the conductive film to be the source electrode 216a and the drain electrode 216b is partly etched to form the source electrode 216a and the drain electrode 216b (see FIG. 20B).

Next, second heat treatment is preferably performed. The description of the first heat treatment can be referred to for the second heat treatment. By the second heat treatment, impurities such as hydrogen and water can be removed from the multi-layer film 206.

Figure 20C:
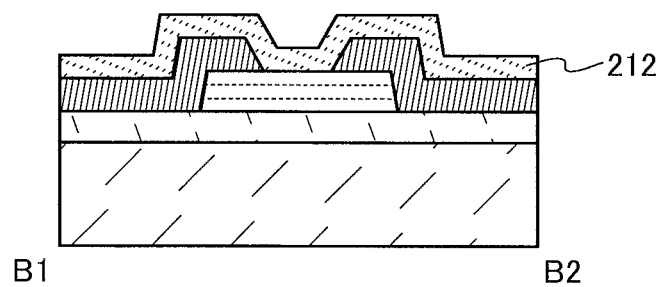

Next, the gate insulating film 212 is formed (see FIG. 20C). For the method for forming the gate insulating film 212, the description of the method for forming the gate insulating film 112 is referred to.

Next, a conductive film to be the gate electrode 204 is formed. For the method for forming the conductive film to be the gate electrode 204, the description of the method for forming the conductive film to be the gate electrode 104 is referred to.

Figure 21A:
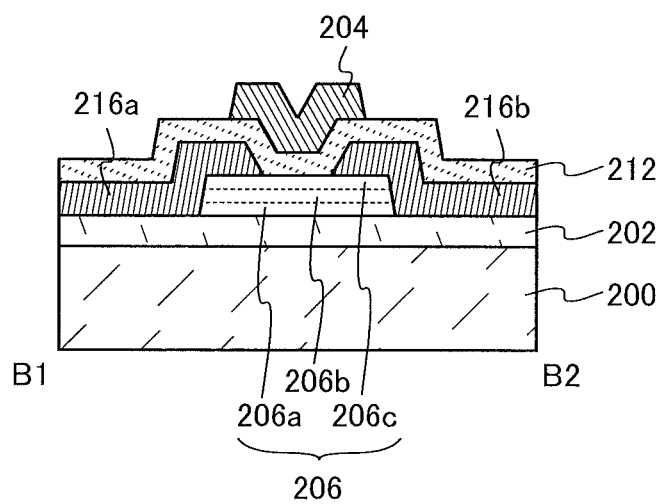
FIGS. 21A and 21B are cross-sectional views illustrating a fabrication method of a semiconductor device of one embodiment of the present invention.

Next, the conductive film to be the gate electrode 204 is partly etched to form the gate electrode 204 (see FIG. 21A).

Figure 21B:
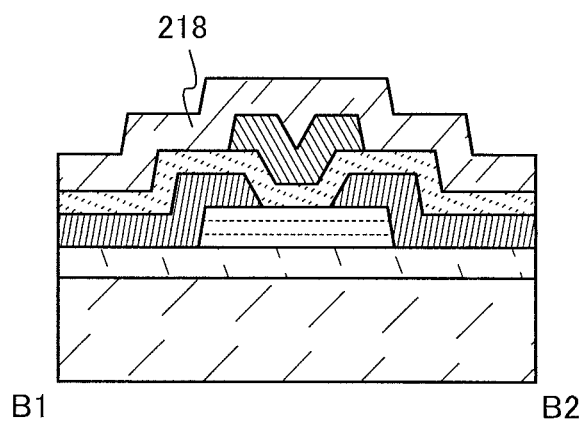

Next, the protective insulating film 218 is formed (see FIG. 21B). For the method for forming the protective insulating film 218, the description of the method for forming the protective insulating film 118 is referred to.

In the above manner, the transistor can be fabricated.

This transistor has stable electrical characteristics because oxygen vacancies in the oxide semiconductor layer 206b of the multi-layer film 206 are reduced.

<2-2-3. Electrical Characteristics of Transistor Structure (2-1)>

Here, a TGTC structure transistor was fabricated and the electrical characteristics thereof were measured.

The transistor structure is described with reference to FIG. 19B.

A glass substrate was used as the substrate 200.

As the oxide layer 206a, a 5-nm-thick oxide layer formed by a sputtering method using an In—Ga—Zn oxide (the atomic ratio of In to Ga and Zn is 1:3:2) target was used. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

As the oxide semiconductor layer 206b, a 15-nm-thick oxide semiconductor layer formed by a sputtering method using an In—Ga—Zn oxide (the atomic ratio of In to Ga and Zn is 1:1:1) target was used. Note that an argon gas (flow rate: 30 sccm) and an oxygen gas (flow rate: 15 sccm) were used as a deposition gas, the pressure was set at 0.4 Pa, the substrate temperature was set at 300° C. or 400° C., and a DC power of 0.5 kW was applied.

As the oxide layer 206c, a 5-nm-thick oxide layer formed by a sputtering method using an In—Ga—Zn oxide (the atomic ratio of In to Ga and Zn is 1:3:2) target was used. Note that an argon gas (flow rate: 30 sccm) and an oxygen gas (flow rate: 15 sccm) were used as a deposition gas, the pressure was set at 0.4 Pa, the substrate temperature was set at 200° C., and a DC power of 0.5 kW was applied.

As the source electrode 216a and the drain electrode 216b, a 100-nm-thick tungsten film formed by a sputtering method was used.

As the gate insulating film 212, a 20-nm-thick silicon oxynitride film formed by a CVD method was used. Note that an $SiH_4$ gas (flow rate: 1 sccm) and an $N_2O$ gas (flow rate: 800 sccm) were used as a deposition gas, the pressure was set at 100 Pa, the substrate temperature was set at 350° C., and a 60 MHz high-frequency power of 150 W was applied.

As the gate electrode 204, a multi-layer film in which a 30-nm-thick tantalum nitride layer and a 135-nm-thick tungsten layer, which were formed by a sputtering method, were stacked in this order was used.

In the above manner, the transistor was fabricated.

Figure 22A:
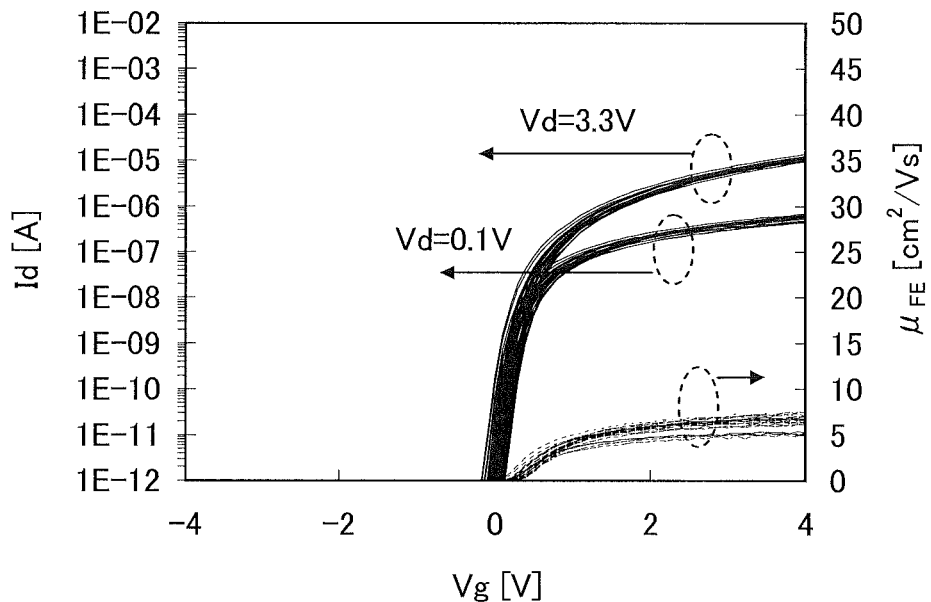
FIGS. 22A and 22B each show Vg-Id characteristics of a transistor.
Figure 22B:
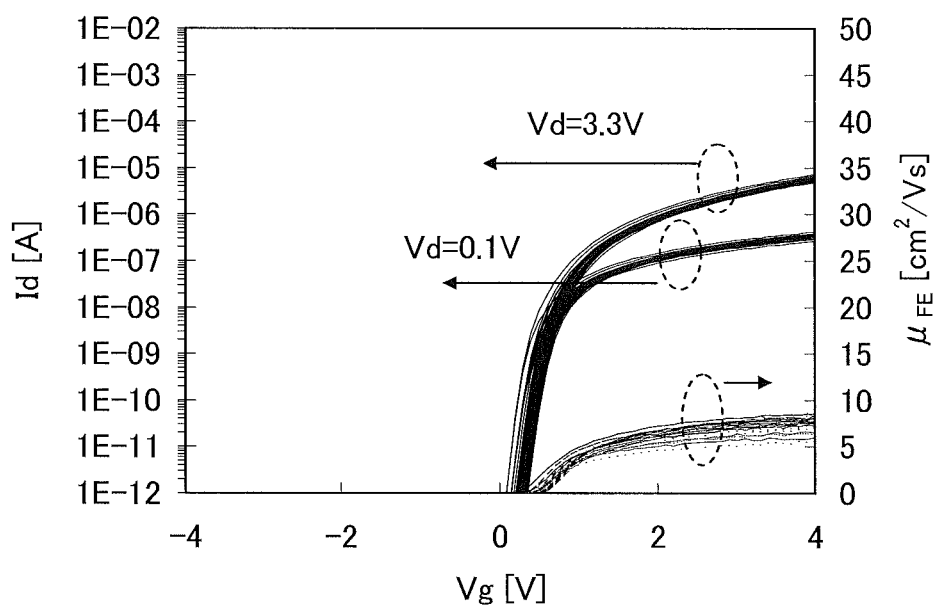

First, the Vg-Id curves of the transistors were obtained by the measurement performed at 25 points on the substrate 200 and are shown together in FIGS. 22A and 22B. Here, the drain current Id was measured under conditions that the drain voltage Vd was 0.1 V or 3.3 V and the gate voltage Vg was swept from −4 V to 4 V.

Note that a drain voltage refers to a potential difference between a source electrode and a drain electrode when the potential of the source electrode is used as a reference potential. A gate voltage refers to a potential difference between the source electrode and a gate electrode when the potential of the source electrode is used as a reference potential. A drain current refers to the value of a current flowing between the source electrode and the drain electrode.

FIG. 22A shows Vg-Id characteristics of the transistors with a channel length L of 0.61 μm and a channel width W of 1 μm. FIG. 22B shows Vg-Id characteristics of the transistors with a channel length L of 1.06 μm and a channel width W of 1 µm. Note that the field-effect mobility ($\mu_{FE}$) of the transistors with the drain voltage Vd of 0.1 V can be read off from the scale on the right axis of the graph.

FIGS. 22A and 22B show that fluctuation in the Vg-Id characteristics of the transistors is small.

Next, a positive gate BT test and a negative gate BT test were performed on the transistors.

In the positive gate BT test, the substrate temperature was first set at 40° C. and the Vg-Id characteristics were measured. Then, the substrate temperature was set at 150° C., the gate voltage Vg was set at 3.3 V, the drain voltage Vd was set at 0 V, and the transistors were held for one hour. After that, the gate voltage Vg was set at 0 V, the substrate temperature was set at 40° C., and the Vg-Id characteristics were measured.

In the negative gate BT test, the substrate temperature was first set at 40° C. and the Vg-Id characteristics were measured, and then the substrate temperature was set at 150° C., the gate voltage Vg was set at −3.3 V, the drain voltage Vd was set at 0 V, and the transistors were held for one hour. After that, the substrate temperature was set at 40° C., the gate voltage Vg was set at 0 V, and the Vg-Id characteristics were measured.

Figure 23A:
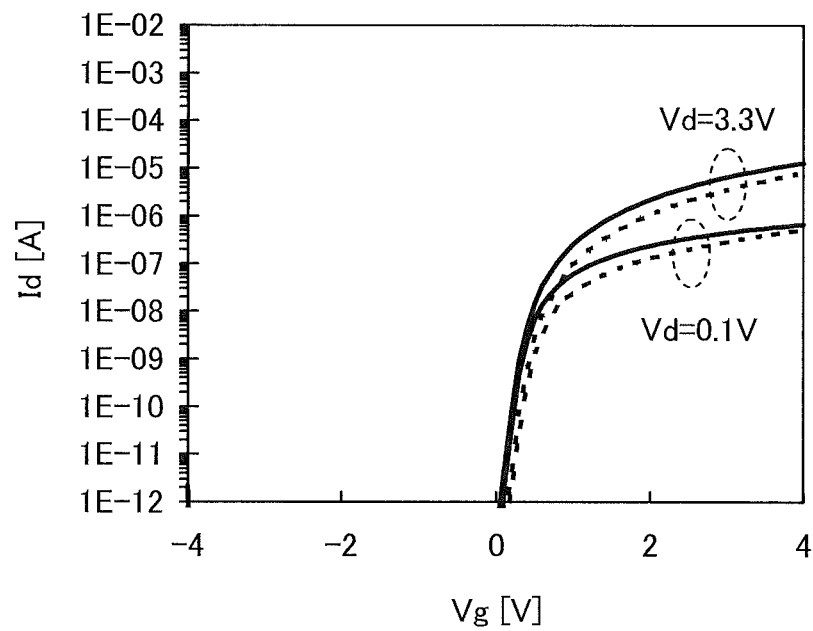
FIGS. 23A and 23B each show results of a gate BT test.
Figure 23B:
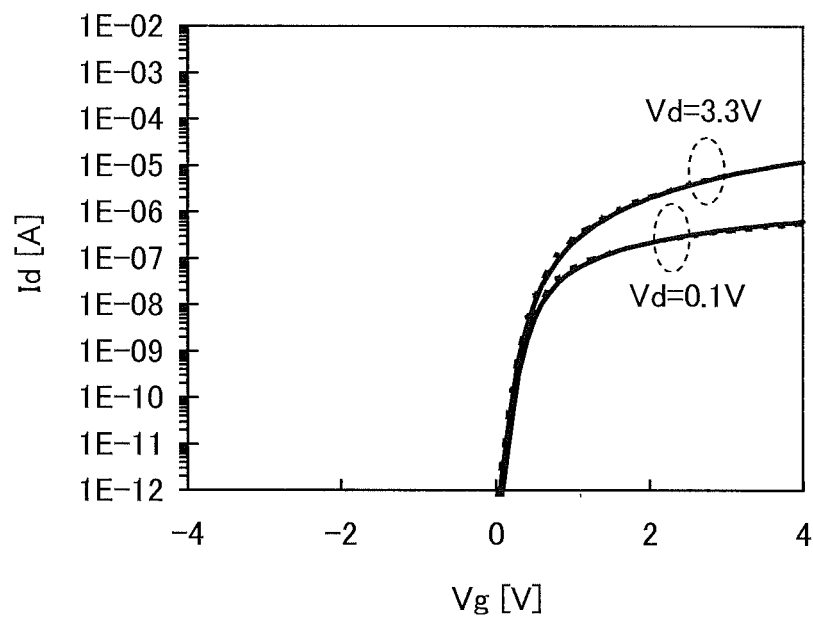

FIG. 23A shows the results of the positive gate BT test carried out on the transistors. FIG. 23B shows the results of the negative gate BT test carried out on the transistors. Note that in each of FIGS. 23A and 23B, the Vg-Id characteristics before the gate BT test are denoted by solid lines, and the Vg-Id characteristics after the gate BT test are denoted by broken lines. After either reliability test, the threshold voltage of the transistor was slightly changed by, specifically, 0.5 V or less.

Accordingly, the above results show that the transistors have stable electrical characteristics.

<3. Application Products>

A transistor disclosed in this specification can be applied to a variety of electronic devices (including game machines) and electric devices. Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, and IC chips. Examples of the electric devices include high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples of the electric devices include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices and electric devices are illustrated in FIG. 24, FIG. 25, FIGS. 26A to 26C, and FIGS. 27A to 27C.

A structure and operation of an alarm device typified by a smoke detector are described. In this section, as an example of the alarm device, a structure of a fire alarm is described with reference to FIG. 24, FIG. 25, FIGS. 26A to 26C, and FIG. 27A.

A fire alarm in this specification refers to any device which raises an alarm over fire occurrence instantly, and for example, a residential fire alarm, an automatic fire alarm system, and a fire detector used for the automatic fire alarm system are included in its category.

Figure 24:
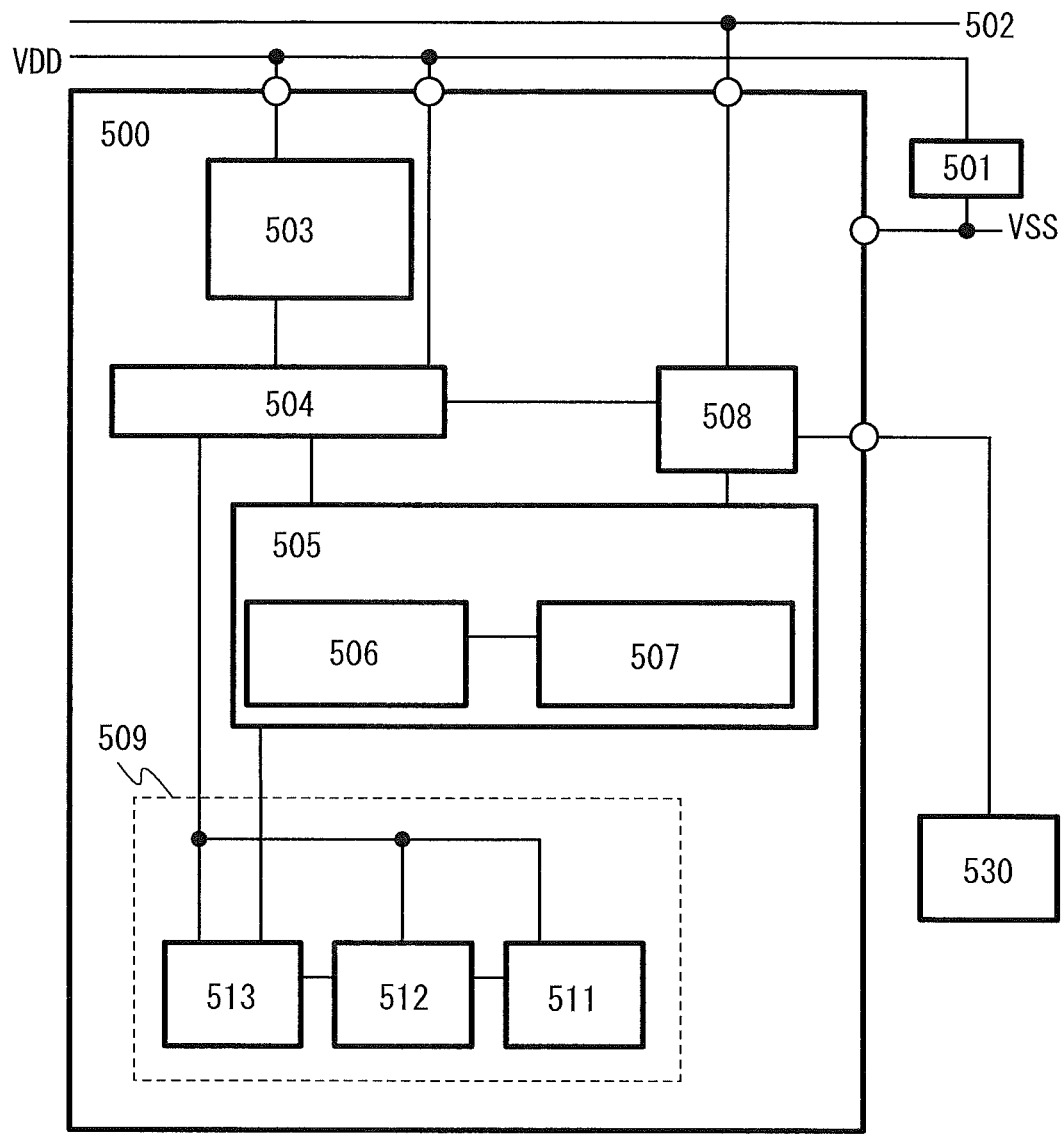
FIG. 24 is a block diagram illustrating an example of a semiconductor device of one embodiment of the present invention.

An alarm device illustrated in FIG. 24 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device described in this section.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved as compared with the case where power is continuously supplied to the above structures.

In the case where a transistor is used as the power gate 504, it is preferable to use a transistor which has an extremely low off-state current and is used for the nonvolatile memory portion 507, for example, a transistor including an oxide semiconductor. With the use of such a transistor, leakage current can be reduced when supply of power is stopped by the power gate 504, so that a reduction in power consumption of the alarm device can be achieved.

A direct-current power source 501 may be provided in the alarm device described in this section so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm device described in this section does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

Figure 25:
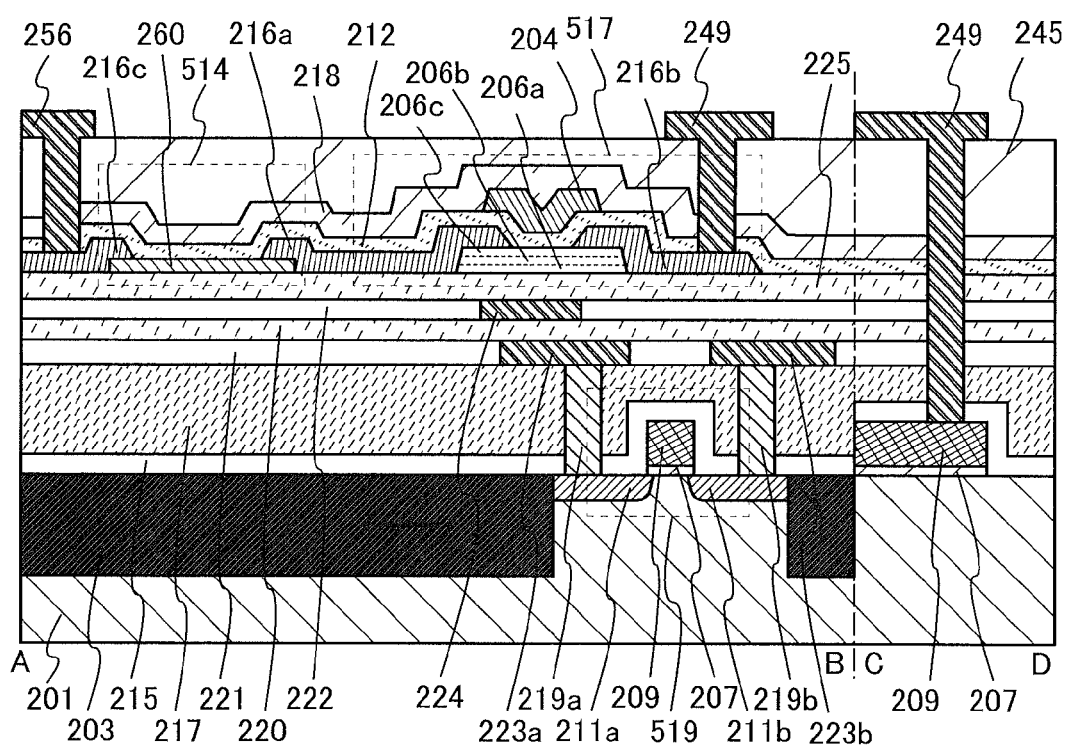
FIG. 25 is a cross-sectional view illustrating an example of a semiconductor device of one embodiment of the present invention.

FIG. 25 illustrates part of the cross section of the alarm device. In the alarm device, element isolation regions 203 are formed in a p-type semiconductor substrate 201, and an n-channel transistor 519 including a gate insulating film 207, a gate electrode 209, n-type impurity regions 211*a* and 211*b*, an insulating film 215, and an insulating film 217 is formed. Here, the n-channel transistor 519 is formed using a semiconductor other than an oxide semiconductor, such as single crystal silicon, so that the transistor 519 can operate at a sufficiently high speed. Accordingly, a volatile memory portion of a CPU that can achieve sufficiently high speed access can be formed.

In addition, contact plugs 219*a* and 219*b* are formed in openings which are formed by partly etching the insulating films 215 and 217, and an insulating film 221 having groove portions is formed over the insulating film 217 and the contact plugs 219*a* and 219*b*. Wirings 223*a* and 223*b* are formed in the groove portions of the insulating film 221. An insulating film 220 is formed over the insulating film 221 and the wirings 223*a* and 223*b* by a sputtering method, a CVD method, or the like, and an insulating film 222 having a groove portion is formed over the insulating film 220. An electrode 224 is formed in the groove portion of the insulating film 222. The electrode 224 functions as a back gate electrode of a second transistor 517. The electrode 224 can control the threshold voltage of the second transistor 517.

Moreover, an insulating film 225 is formed over the insulating film 222 and the electrode 224 by a sputtering method, a CVD method, or the like.

The second transistor 517 and a photoelectric conversion element 514 are provided over the insulating film 225. The second transistor 517 includes an oxide layer 206*a*, an oxide semiconductor layer 206*b*, an oxide layer 206*c*, a source electrode 216*a* and a drain electrode 216*b* in contact with the top surface of the stack of the oxide layer 206*a*, the oxide semiconductor layer 206*b*, and the oxide layer 206*c*, a gate insulating film 212, a gate electrode 204, and a protective insulating film 218. Moreover, an insulating film 245 covers the photoelectric conversion element 514 and the second transistor 517, and a wiring 249 is formed over the insulating film 245 so as to be in contact with the drain electrode 216*b*. The wiring 249 functions as the node which electrically connects the drain electrode 216*b* of the second transistor 517 to the gate electrode 209 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the re-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with an extremely low off-state current is preferably used. As the transistor with an extremely low off-state current, a transistor including an oxide semiconductor is preferably used. With such a structure, the potential of the node FD can be held for a long time.

In the structure in FIG. 25, the photoelectric conversion element 514 is electrically connected to the second transistor 517 and is provided over the insulating film 225.

The photoelectric conversion element 514 includes a semiconductor layer 260 over the insulating film 225, and the source electrode 216a and an electrode 216c which are in contact with the top surface of the semiconductor layer 260. The source electrode 216a is an electrode functioning as the source electrode or the drain electrode of the second transistor 517 and electrically connects the photoelectric conversion element 514 to the second transistor 517.

Over the semiconductor layer 260, the source electrode 216a, and the electrode 216c, the gate insulating film 212, the protective insulating film 218, and the insulating film 245 are provided. Further, a wiring 256 is formed over the insulating film 245 and is in contact with the electrode 216c through an opening provided in the gate insulating film 212, the protective insulating film 218, and the insulating film 245.

The electrode 216c can be formed in steps similar to those of the source electrode 216a and the drain electrode 216b, and the wiring 256 can be formed in steps similar to those of the wiring 249.

As the semiconductor layer 260, a semiconductor layer which can perform photoelectric conversion is provided, and for example, silicon or germanium can be used. In the case of using silicon, the semiconductor layer 260 functions as an optical sensor which senses visible light. Further, there is a difference, between silicon and germanium, in wavelengths of electromagnetic waves that can be absorbed. When the semiconductor layer 260 includes germanium, a sensor which senses an infrared ray can be obtained.

In the above manner, the sensor portion 509 including the optical sensor 511 can be incorporated into the microcomputer 500, so that the number of components can be reduced and the size of the housing of the alarm device can be reduced.

In the fire alarm including the above-described IC chip, the CPU 505 in which a plurality of circuits including the above transistor are combined and mounted on one IC chip is used.

Figure 26A:
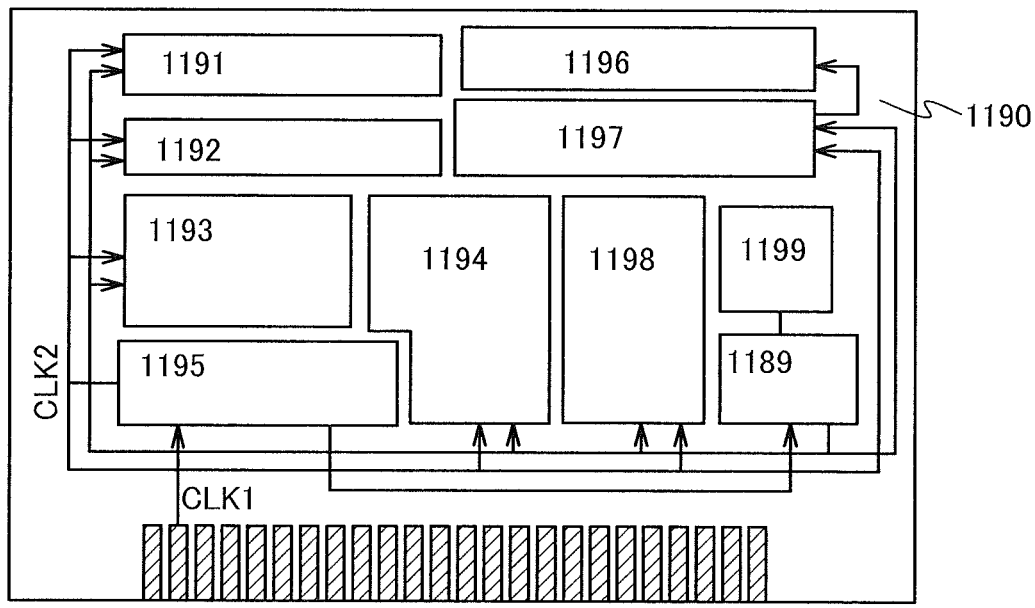
FIGS. 26A to 26C are block diagrams illustrating an example of a semiconductor device of one embodiment of the present invention.
Figure 26B:
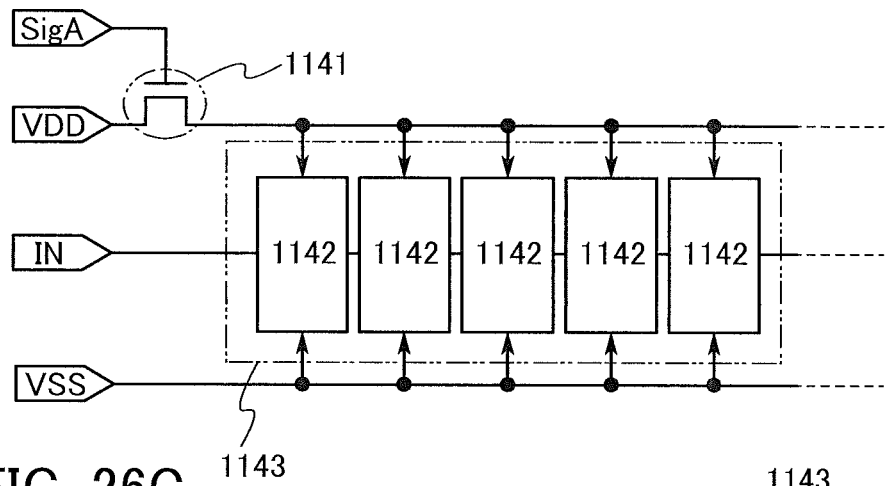
Figure 26C:
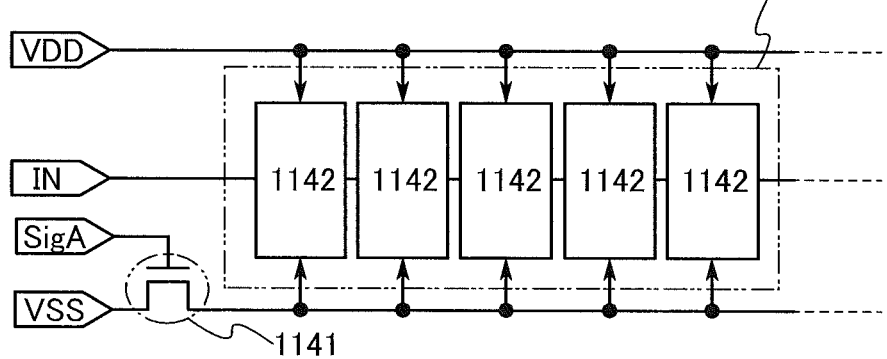

FIGS. 26A to 26C are block diagrams illustrating a specific configuration of a CPU at least partly including the above transistor.

The CPU illustrated in FIG. 26A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 26A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 26A, a memory cell is provided in the register 1196. As the memory cell of the register 1196, the above transistor can be used.

In the CPU illustrated in FIG. 26A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 26B or FIG. 26C. Circuits illustrated in FIGS. 26B and 26C are described below.

FIGS. 26B and 26C each illustrate an example of the configuration of a memory circuit in which any one of the above transistors is used as a switching element which controls supply of a power supply potential to a memory cell.

The memory device illustrated in FIG. 26B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 26B, any of the above transistors is used as the switching element 1141, and the switching of the transistor is controlled by a signal SigA supplied to a gate electrode layer thereof Note that FIG. 26B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 26B, the switching element 1141 may control the supply of the low-level power supply potential VSS.

In FIG. 26C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 27A:
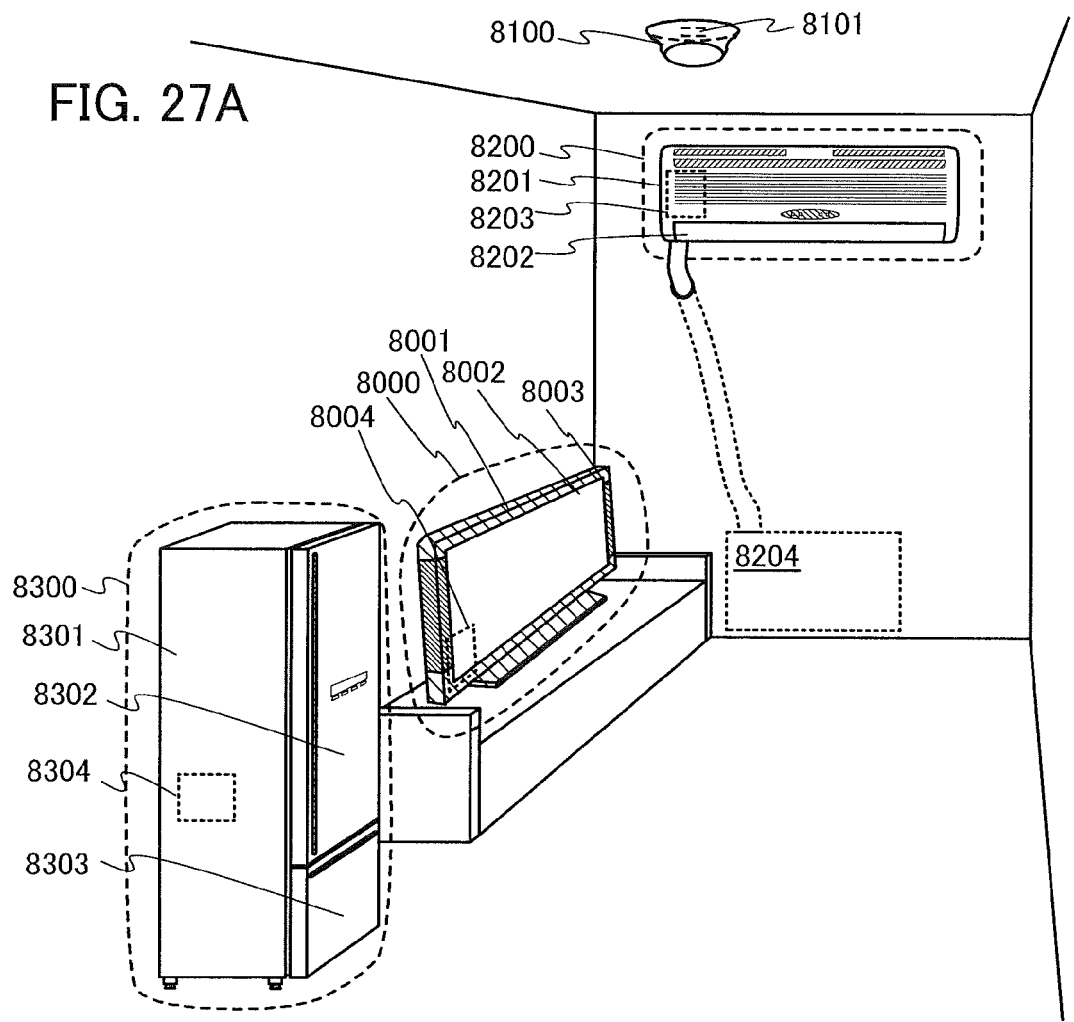
FIGS. 27A to 27C each illustrate an example of an electronic device of one embodiment of the present invention.

In a television set 8000 in FIG. 27A, a display portion 8002 is incorporated in a housing 8001. The display portion 8002 displays an image and a speaker portion 8003 can output sound. The above transistor can be used for the display portion 8002.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

In addition, the television set 8000 may include a memory or a CPU 8004 for performing information communication. The above transistor, memory device, or CPU is used for the CPU 8004 or the memory, whereby a reduction in power consumption of the television set 8000 can be achieved.

In FIG. 27A, an alarm device 8100 is a residential fire alarm, which is an example of an electric device including a sensor portion and a microcomputer 8101. Note that the microcomputer 8101 is an example of an electronic device including a CPU in which the above transistor is used.

In FIG. 27A, an air conditioner which includes an indoor unit 8200 and an outdoor unit 8204 is an example of an electric device including the CPU in which the above transistor is used. Specifically, the indoor unit 8200 includes a housing 8201, an air outlet 8202, a CPU 8203, and the like. Although the CPU 8203 is provided in the indoor unit 8200 in FIG. 27A, the CPU 8203 may be provided in the outdoor unit 8204. Alternatively, the CPU 8203 may be provided in both the indoor unit 8200 and the outdoor unit 8204. By using the above transistor as the CPU in the air conditioner, a reduction in power consumption of the air conditioner can be achieved.

In FIG. 27A, an electric refrigerator-freezer 8300 is an example of an electric device which is provided with the CPU including an oxide semiconductor. Specifically, the electric refrigerator-freezer 8300 includes a housing 8301, a door for a refrigerator 8302, a door for a freezer 8303, a CPU 8304, and the like. In FIG. 27A, the CPU 8304 is provided in the housing 8301. When the above transistor is used as the CPU 8304 of the electric refrigerator-freezer 8300, a reduction in power consumption of the electric refrigerator-freezer 8300 can be achieved.

Figure 27B:
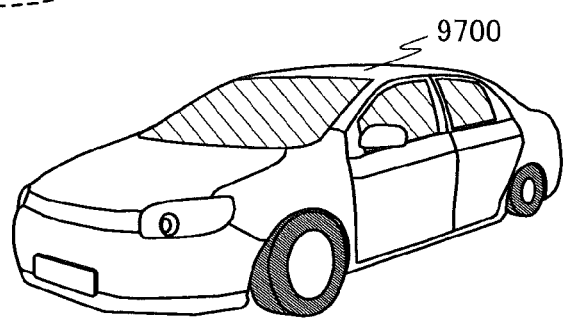
Figure 27C:
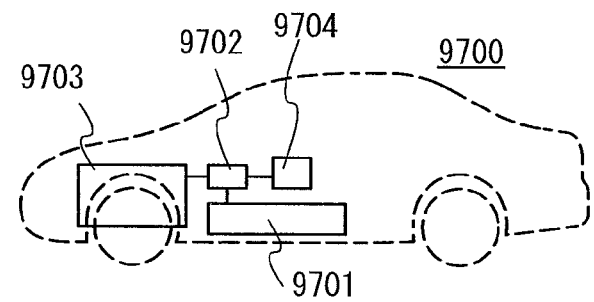

FIGS. 27B and 27C illustrate an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the above transistor is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

REFERENCE NUMERALS

100: substrate, 104: gate electrode, 106: multi-layer film, 106a: oxide layer, 106b: oxide semiconductor layer, 106c: oxide layer, 106d: source region, 106e: drain region, 112: gate insulating film, 116a: source electrode, 116b: drain electrode, 118: protective insulating film, 118a: silicon oxide layer, 118b: silicon oxide layer, 118c: silicon nitride layer, 200: substrate, 201: semiconductor substrate, 202: base insulating film, 203: element isolation region, 204: gate electrode, 206: multi-layer film, 206a: oxide layer, 206b: oxide semiconductor layer, 206c: oxide layer, 207: gate insulating film, 209: gate electrode, 211a: impurity region, 211b: impurity region, 212: gate insulating film, 215: insulating film, 216a: source electrode, 216b: drain electrode, 216c: electrode, 217: insulating film, 218: protective insulating film, 219a: contact plug, 219b: contact plug, 220: insulating film, 221: insulating film, 222: insulating film, 223a: wiring, 223b: wiring, 224: electrode, 225: insulating film, 245: insulating film, 249: wiring, 256: wiring, 260: semiconductor layer, 500: microcomputer, 501: direct-current power source, 502: bus line, 503: power gate controller, 504: power gate, 505: CPU, 506: volatile memory portion, 507: nonvolatile memory portion, 508: interface, 509: sensor portion, 511: optical sensor, 512: amplifier, 513: AD converter, 514: photoelectric conversion element, 517: transistor, 519: transistor, 530: light-emitting element, 1000: target, 1001: ion, 1002: sputtered particle, 1003: deposition surface, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4000: film formation apparatus, 4001: atmosphere-side substrate supply chamber, 4002: atmosphere-side substrate transfer chamber, 4003a: load lock chamber, 4003b: unload lock chamber, 4004: transfer chamber, 4005: substrate heating chamber, 4006a: film formation chamber, 4006b: film formation chamber, 4006c: film formation chamber, 4101: cassette port, 4102: alignment port, 4103: transfer robot, 4104: gate valve, 4105: heating stage, 4106: target, 4107: attachment protection plate, 4108: substrate stage, 4109: substrate, 4110: cryotrap, 4111: stage, 4200: vacuum pump, 4201: cryopump, 4202: turbo molecular pump, 4300: mass flow controller, 4301: refiner, 4302: gas heating system, 8000: television set, 8001: housing, 8002: display portion, 8003: speaker portion, 8004: CPU, 8100: alarm device, 8101: microcomputer, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: control circuit, 9703: driving device, and 9704: processing unit.

This application is based on Japanese Patent Application serial No. 2012-210230 filed with the Japan Patent Office on Sep. 24, 2012, the entire contents of which are hereby incorporated by reference.

The invention claimed is:

1. A semiconductor device comprising:
a multi-layer film including a first oxide layer, an oxide semiconductor layer over the first oxide layer, and a second oxide layer over the oxide semiconductor layer;
a gate insulating film in contact with the multi-layer film;
a gate electrode overlapping with the multi-layer film with the gate insulating film therebetween; and
a protective layer over the gate electrode, the protective layer comprising a first layer and a second layer over the first layer,
wherein each of the first oxide layer, the second oxide layer, and the oxide semiconductor layer contains indium,
wherein the oxide semiconductor layer is in contact with each of the first oxide layer and the second oxide layer,
wherein an energy at a bottom of a conduction band of the first oxide layer is larger than an energy at a bottom of a conduction band of the oxide semiconductor layer,
wherein an energy at a bottom of a conduction band of the second oxide layer is larger than the energy at the bottom of the conduction band of the oxide semiconductor layer,
wherein at least one of the first oxide layer, the oxide semiconductor layer, the second oxide layer includes a crystal,
wherein a c-axis of the crystal is substantially parallel to a normal vector of a surface of the second oxide layer,
wherein a concentration of silicon in the oxide semiconductor layer is less than $1\times10^{19}$ atoms/cm$^3$,
wherein the first layer comprises silicon oxide and is configured to release oxygen by heat treatment, and
wherein the second layer comprises silicon nitride which is configured to block oxygen.

2. The semiconductor device according to claim 1,
wherein a gap between the energy at the bottom of the conduction band of the first oxide layer and the energy at the bottom of the conduction band of the oxide semiconductor layer is greater than or equal to 0.05 eV and less than or equal to 2 eV, and
wherein a gap between the energy at the bottom of the conduction band of the second oxide layer and the energy at the bottom of the conduction band of the oxide semiconductor layer is greater than or equal to 0.05 eV and less than or equal to 2 eV.

3. The semiconductor device according to claim 1, further comprising:
a source electrode and a drain electrode, wherein each of the source electrode and the drain electrode is in contact with side edges of the oxide semiconductor layer.

4. The semiconductor device according to claim 1,
wherein each of the oxide semiconductor layer, the first oxide layer, and the second oxide layer comprises at least one of indium, zinc, and a metal,
wherein the metal is selected from aluminum, titanium, gallium, yttrium, zirconium, tin, lanthanum, cerium, neodymium, and hafnium, and
wherein an atomic ratio of indium to the metal in each of the first oxide layer and the second oxide layer is lower than an atomic ratio of indium to the metal in the oxide semiconductor layer.

5. The semiconductor device according to claim 1, wherein a carrier density in the oxide semiconductor layer is less than $1\times10^{17}$ /cm$^3$.

6. The semiconductor device according to claim 1, wherein a concentration of hydrogen in the oxide semiconductor layer is less than or equal to $2\times10^{20}$ atoms/cm$^3$.

7. The semiconductor device according to claim 1, further comprising:
an insulating film in contact with the multi-layer film,
wherein the insulating film contains a peroxide radical, and
wherein a spin density attributed to the peroxide radical is greater than or equal to $5\times10^{17}$ spins/cm$^3$.

8. The semiconductor device according to claim 1,
wherein the protective layer further comprises a third layer under the first layer, and
wherein the third layer comprises silicon oxide or silicon oxynitride,
wherein a spin density in the third layer attributed to a signal with a g factor of 2.001 in ESR is less than or equal to $3\times10^{17}$ spins/cm$^3$.

9. The semiconductor device according to claim 1,
wherein the gate insulating film comprises aluminum oxide.

* * * * *

UNITED STATES PATENT AND TRADEMARK OFFICE
CERTIFICATE OF CORRECTION

PATENT NO. : 9,831,351 B2  
APPLICATION NO. : 15/040092  
DATED : November 28, 2017  
INVENTOR(S) : Shunpei Yamazaki Page 1 of 1

It is certified that error appears in the above-identified patent and that said Letters Patent is hereby corrected as shown below:

In the Claims

Column 48, Line 50, in Claim 8, replace "$10^{'17}$" with --$10^{17}$--.

Signed and Sealed this
Twentieth Day of March, 2018

Andrei Iancu
*Director of the United States Patent and Trademark Office*